(12) United States Patent
Hung et al.

(10) Patent No.: US 12,131,986 B2
(45) Date of Patent: Oct. 29, 2024

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Tuan-Yu Hung, Changhua County (TW); Ching-Feng Yang, Taipei (TW); Hung-Jui Kuo, Hsinchu (TW); Kai-Chiang Wu, Hsinchu (TW); Ming-Che Ho, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 8 days.

(21) Appl. No.: 18/303,548

(22) Filed: Apr. 19, 2023

(65) Prior Publication Data

US 2023/0260885 A1     Aug. 17, 2023

Related U.S. Application Data

(60) Continuation of application No. 17/327,785, filed on May 24, 2021, now Pat. No. 11,658,105, which is a division of application No. 16/513,727, filed on Jul. 17, 2019, now Pat. No. 11,018,083.

(51) Int. Cl.
| | |
|---|---|
| *H01L 23/498* | (2006.01) |
| *H01L 21/56* | (2006.01) |
| *H01L 21/768* | (2006.01) |
| *H01L 23/00* | (2006.01) |
| *H01L 23/31* | (2006.01) |

(Continued)

(52) U.S. Cl.
CPC ........ *H01L 23/49827* (2013.01); *H01L 21/56* (2013.01); *H01L 21/76816* (2013.01); *H01L 21/76871* (2013.01); *H01L 23/3107* (2013.01); *H01L 23/481* (2013.01); *H01L 23/66* (2013.01); *H01L 24/09* (2013.01); *H01Q 1/2283* (2013.01); *H01Q 9/0407* (2013.01); *H01Q 9/285* (2013.01);
(Continued)

(58) Field of Classification Search
CPC ........... H01L 23/49827; H01L 23/3107; H01L 23/481; H01L 23/66; H01L 23/552; H01L 21/56; H01L 21/76816; H01L 21/76871; H01L 24/09; H01L 24/19; H01L 2223/6677; H01L 2224/02372; H01Q 1/2283; H01Q 9/0407; H01Q 9/285
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Dao H Nguyen
(74) *Attorney, Agent, or Firm* — JCIPRNET

(57) ABSTRACT

A semiconductor package and a manufacturing method are provided. The manufacturing method includes: forming a through via structure and a dipole structure over a carrier, wherein the through via structure and the dipole structure respectively include an insulating core and a conductive layer covering the insulating core; attaching a semiconductor die onto the carrier, wherein the through via structure and the dipole structure are located aside the semiconductor die; laterally encapsulating the though via structure, the dipole structure and the semiconductor die with an encapsulant; and removing the carrier.

20 Claims, 22 Drawing Sheets

(51) Int. Cl.
*H01L 23/48* (2006.01)
*H01L 23/66* (2006.01)
*H01Q 1/22* (2006.01)
*H01Q 9/04* (2006.01)
*H01Q 9/28* (2006.01)

(52) U.S. Cl.
CPC .............. *H01L 2223/6677* (2013.01); *H01L 2224/02372* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,247,646 B2 * | 1/2016 | Sato .................. H05K 1/185 |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2010/0006330 A1 * | 1/2010 | Fu ........................... H01L 24/19 29/856 |
| 2013/0285254 A1 * | 10/2013 | Kainuma ................ H01L 24/24 257/774 |
| 2017/0033062 A1 * | 2/2017 | Liu ....................... H01L 23/528 |
| 2017/0338195 A1 * | 11/2017 | Wang ..................... H01L 23/66 |
| 2017/0346185 A1 * | 11/2017 | Wang .................... H01Q 1/2283 |
| 2018/0025999 A1 * | 1/2018 | Yu ........................ H01L 23/485 257/428 |
| 2020/0013735 A1 * | 1/2020 | Liu ....................... H01L 23/481 |
| 2020/0035607 A1 * | 1/2020 | Lee ........................ H01L 24/09 |

* cited by examiner

SEMICONDUCTOR PACKAGE AND MANUFACTURING METHOD THEREOF

CROSS-REFERENCE TO RELATED APPLICATION

This application is a continuation application of and claims the priority benefit of U.S. application Ser. No. 17/327,785, filed on May 24, 2021, now allowed, which is a divisional application of and claims the priority benefit of U.S. application Ser. No. 16/513,727, filed on Jul. 17, 2019, now issued as U.S. Pat. No. 11,018,083. The entirety of each of the above-mentioned patent applications is hereby incorporated by reference herein and made a part of this specification.

BACKGROUND

A three-dimensional semiconductor package often includes through interposer vias (TIVs). TIV is a conductive pillar extending between opposite sides of an interposer substrate, so as to couple vertically adjacent device dies. Due to manufacturing variations, some of the TIVs may be shorter than others, and terminals of these TIVs may be recessed from a surface of the interposer substrate. As a result, electrical connection between some vertically adjacent device dies may be failed. Furthermore, dome vertices at top portions of some TIVs may be offset from central axes of these TIVs. When these TIVs are functioned as alignment references during device die placing, misalignment of the device dies may occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
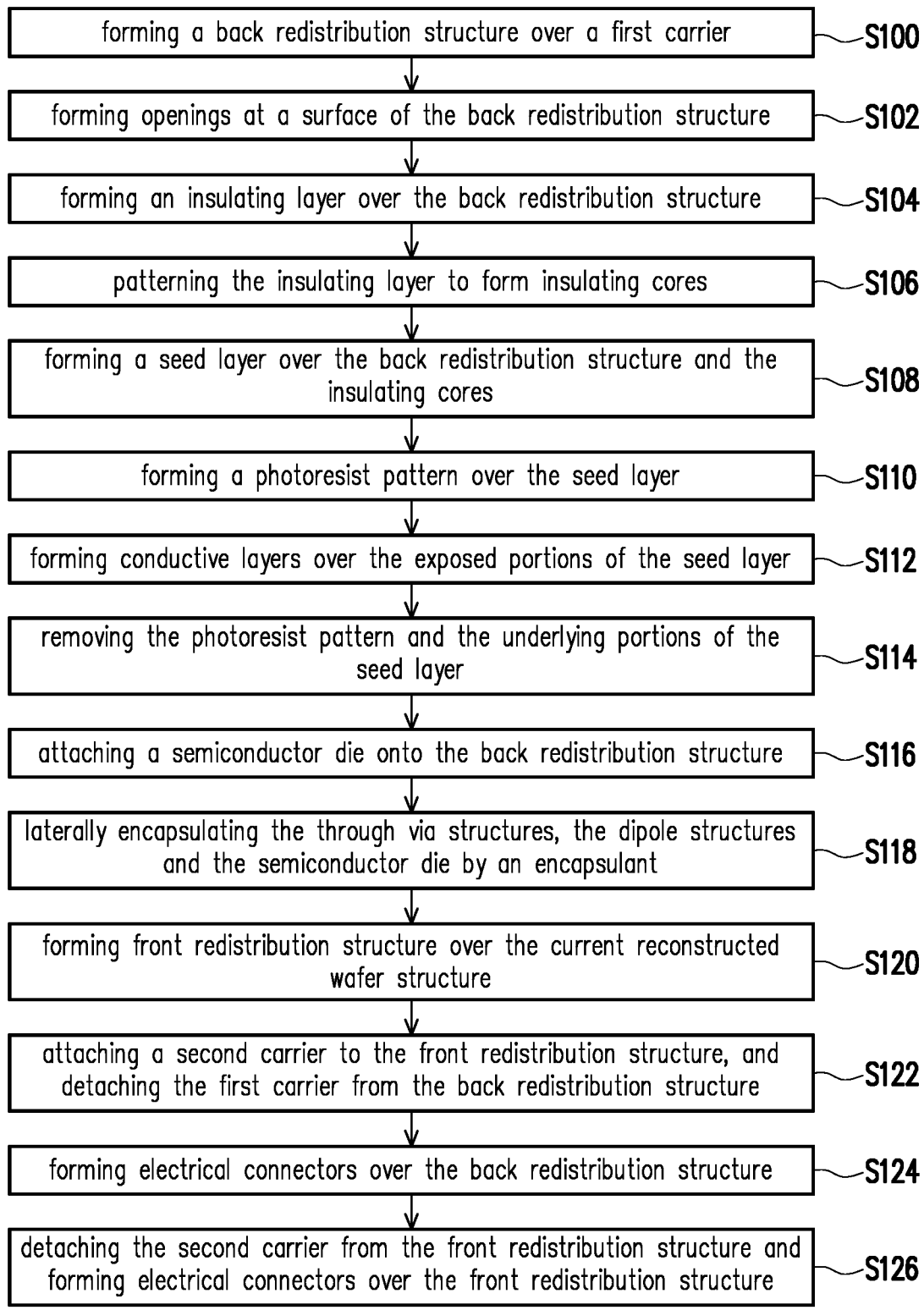
FIG. 1 is a process flow diagram of a manufacturing method of a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

Embodiments will be described with respect to a specific context, namely a semiconductor package with a through encapsulant via (or referred as through interposer via (TIV)) and a dipole structure. However, to other circuits, layouts and package structures is desired. Throughout the various views and illustrative embodiments, like reference numbers are used to designate like elements.

Figure 2A:
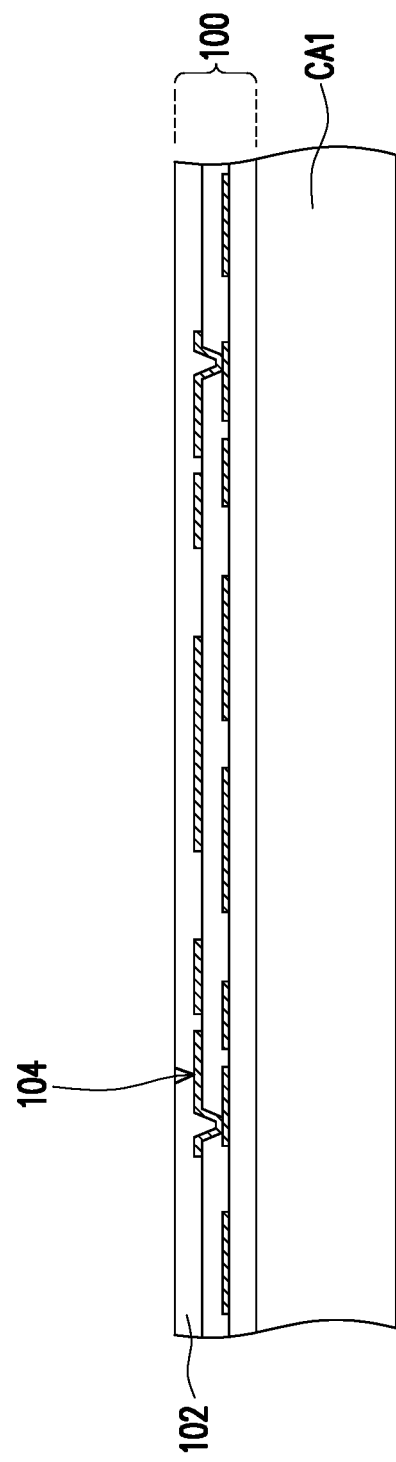
FIG. 2A through FIG. 2N are cross-sectional views illustrating structures at various stages during the manufacturing method of the semiconductor package according to some embodiments of the present disclosure.

FIG. 1 is a process flow diagram of a manufacturing method of a semiconductor package according to some embodiments of the present disclosure. FIG. 2A through FIG. 2N are cross-sectional views illustrating structures at various stages during the manufacturing method of the semiconductor package according to some embodiments of the present disclosure.

Referring to FIG. 1 and FIG. 2A, in some embodiments, step S100 is performed, and a redistribution structure 100 is formed over a first carrier CAL The first carrier CA1 is such as a glass carrier. In some embodiments, an adhesion layer (not shown) is pre-formed on a surface of the first carrier CA1, on which the redistribution structure 100 is to be formed. For instance, the adhesion layer may be a light-to-heat-conversion (LTHC) layer, a thermal release layer or the like. Since the redistribution structure 100 is to be attached to the back surface BS of the semiconductor die 118 in the following steps (as shown in FIG. 2I), the redistribution structure 100 may also be referred as a back redistribution structure. In some embodiments, the redistribution structure 100 includes a stack of dielectric layers 102 and redistribution elements 104 formed in the stack of dielectric layers 102. Although three dielectric layers 102 are depicted in FIG. 2A, those skilled in the art may adjust the amount of the dielectric layers 102 in the redistribution structure 100, the present disclosure is not limited thereto. Materials of the dielectric layers 102 may include polymer or other insulating materials. For instance, the dielectric layers 102 may be respectively formed with polyimide, polybenzoxazole, benzocyclobuten, silicones, acrylates, epoxy or combinations thereof. In some embodiments, the dielectric layers 102 are formed with the same material. In alternative embodiments, at least one of the dielectric layers 102 is formed with a material that is different from material(s) of other dielectric layer(s) 102. In addition, a thickness of each dielectric layer 102 may range from 2 µm to 10 µm. The redistribution elements 104 may include conductive vias, conductive traces, the like or combinations thereof, and may be formed of conductive materials, such as Cu, Al, Ti, Ni, the like or combinations thereof.

Figure 2B:
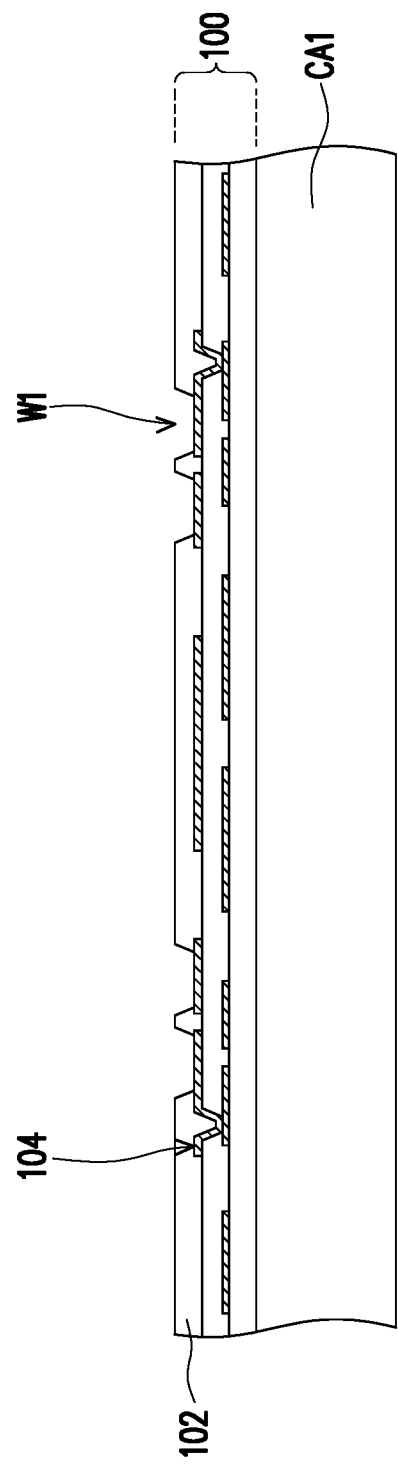

Referring FIG. 1, FIG. 2A and FIG. 2B, step S102 is performed, and some portions of the frontmost dielectric layer(s) 102 (i.e., the topmost dielectric layer(s) 102 shown in FIG. 2B) are removed to form openings W1. In the present disclosure, a front side or a front surface of an element is referred as a side or a surface of this element facing the same direction as the front surface FS of the semiconductor die 118 (as shown in FIG. 2I) to be attached on the redistribution structure 100 in the following steps, whereas a back/rear side or a back/rear surface of this element is referred as a side or a surface facing the same direction as the back surface BS of the semiconductor die 118. In addition, the openings W1 may also be regarded as recesses at a surface of the redistribution structure 100. The openings W1 define locations and dimensions of the through via structures 116a to be formed in the openings W1 afterward (as shown in FIG. 2H). Some of the frontmost redistribution elements 104 (i.e., the topmost redistribution elements 104 shown in FIG. 2B) are exposed by the openings W1, such that the through via structures 116a formed in the following steps (as shown in FIG. 2G) could be electrically connected with these redistribution elements 104. In some embodiments, an aperture of the opening W1 may range from 100 µm to 300 µm.

Figure 2C:
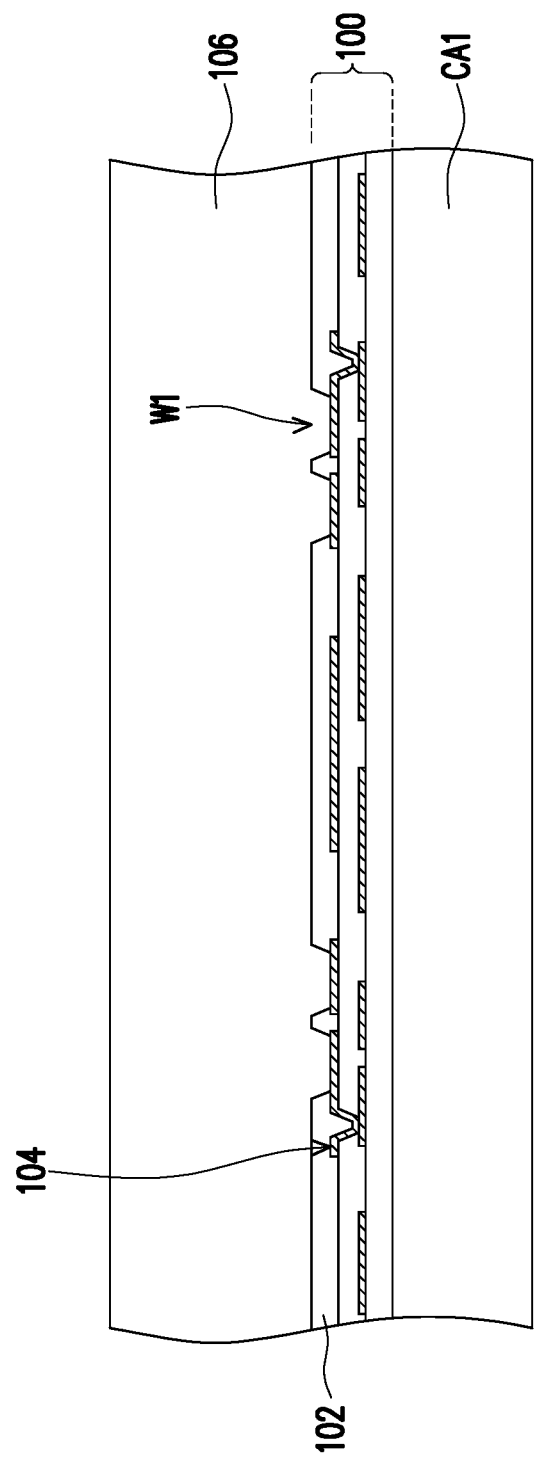

Referring to FIG. 1, FIG. 2B and FIG. 2C, step S104 is performed, and an insulating layer 106 is formed over the redistribution structure 100. The insulating layer 106 may be globally formed over the structure shown in FIG. 2B. As such, a front surface of the redistribution structure 100 (i.e., a top surface of the redistribution structure 100 as shown in FIG. 2C) is covered by the insulating layer 106, and the openings W1 are filled by the insulating layer 106. The insulating layer 106 has a substantially flat front surface (i.e., a top surface as shown in FIG. 2C). A thickness of the insulating layer 106 may range from 100 µm to 300 µm. In some embodiments, the insulating layer 106 may be formed with a photosensitive material, such as polybenzoxazole (PBO), polyimide, benzocyclobutene (BCB), the like or combinations thereof. In alternative embodiments, a material of the insulating layer 106 may be a non-photosensitive material, such as epoxy. In addition, a formation method of the insulating layer 106 may include a solution process (e.g., a spin coating process), a deposition process (e.g., a chemical vapor deposition (CVD) process), a lamination process, the like or combinations thereof.

Figure 2D:
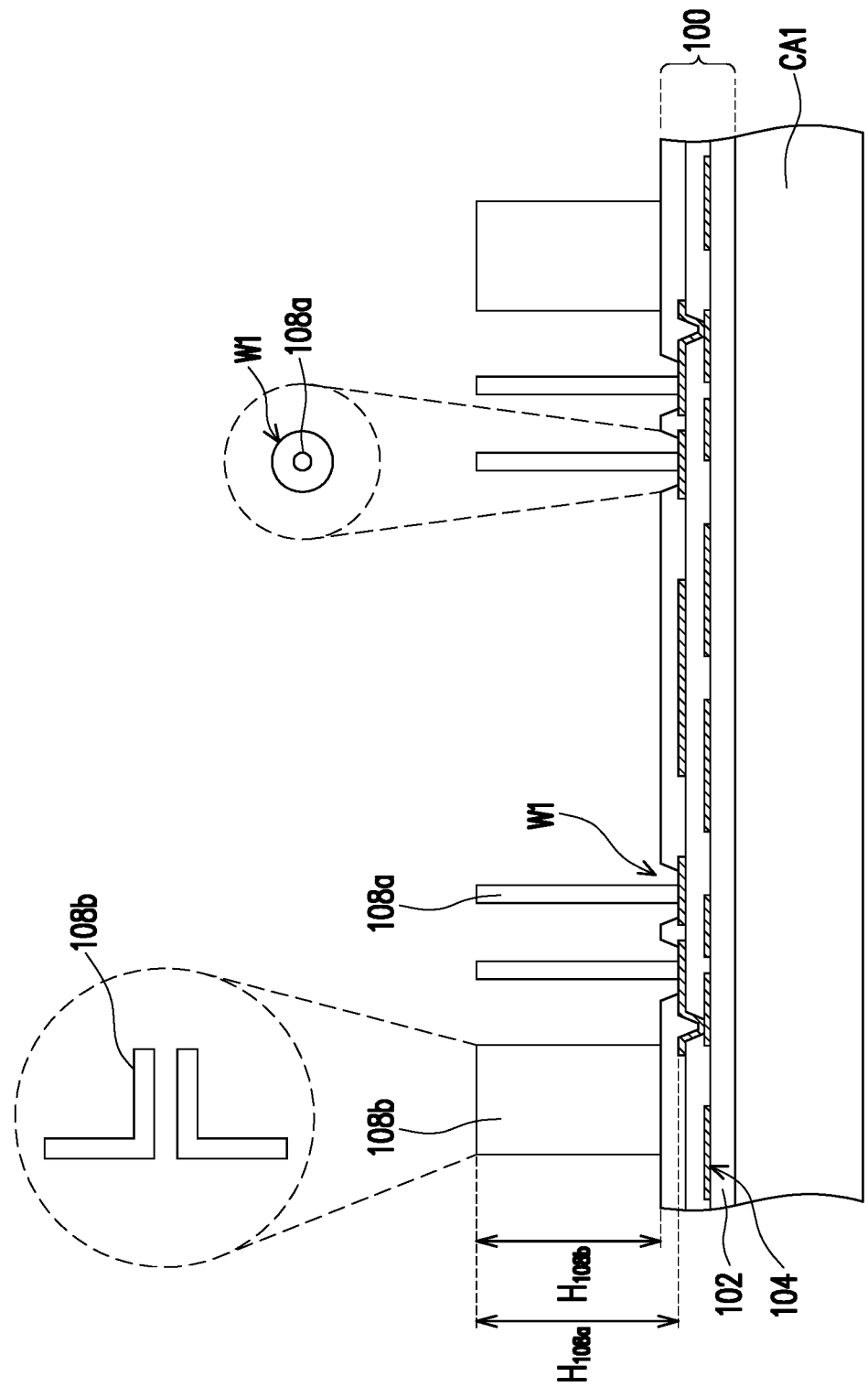

Referring to FIG. 1, FIG. 2C and FIG. 2D, step S106 is performed, and the insulating layer 106 is patterned to form insulating cores 108a and insulating cores 108b. The insulating cores 108a can be regarded as body portions of the through via structures 116a to be completely formed in the following steps (as shown in FIG. 2H), whereas the insulating cores 108b can be regarded as body portions of the dipole structures 116b to be completely formed in the following steps (also shown in FIG. 2H). The insulating cores 108a are respectively located within the spans of the openings W1, whereas the insulating cores 108b are located outside the openings W1. In other words, the insulating cores 108a extends upwardly from bottom surfaces of the openings W1, whereas the insulating cores 108b extends upwardly from the front surface of the redistribution structure 100 (i.e., the top surface of the redistribution structure 100 shown in FIG. 2D) outside the openings W1. In addition, the insulating cores 108a can be regarded as extending into the redistribution structure 100, whereas the insulating cores 108b are located above the redistribution structure 100. Since the insulating cores 108a and 108b are different portions of the same material layer having a substantially flat front surface (i.e., the insulating layer 106 as shown in FIG. 2C), front surfaces of the insulating cores 108a and 108b (i.e., top surfaces of the insulating cores 108a and 108b as shown in FIG. 2D) are substantially coplanar. Therefore, given rear surfaces of the insulating cores 108a are lower than rear surfaces of the insulating cores 108b, a height $H_{108a}$ of the insulating cores 108a is greater than a height $H_{108b}$ of the insulating cores 108b. In some embodiments, the height $H_{108a}$ is substantially equal to a sum of the height $H_{108b}$ and a depth of the opening W1. For instance, the height $H_{108a}$ may range from 100 µm to 300 µm, whereas the height $H_{108b}$ may range from 100 µm to 300 µm. In addition, some adjacent insulating cores 108a and the corresponding openings W1 are spaced apart by a proper distance, such that the semiconductor die 118 could be disposed between these adjacent insulating cores 108a/openings W1 in the following steps (as shown in FIG. 2I). In some embodiments, the insulating cores 108a are closer to the space for accommodating the semiconductor die 118 (as shown in FIG. 2I) than the insulating cores 108b. The areas enclosed by dash lines in FIG. 2D illustrate exemplary top views of the insulating core 108a and the insulating core 108b. As shown in the exemplary top views in FIG. 2D, in some embodiments, top view shapes of the opening W1 and the insulating core 108a are both circular. In addition, a coverage area of the insulating core 108a is smaller than an area of the opening W1, and the insulating core 108a is not in contact with a boundary of the opening W1. On the other hand, in some embodiments, the insulating core 108b is formed in a shape of a dipole antenna. For instance, a top view shape of the insulating core 108b includes a pair of "L-like" patterns. A portion of the pair of "L-like" patterns can be regarded as parallel lines, and another portion of the pair of "L-like" patterns can be regarded as lines extending toward opposite directions from terminals of those parallel lines. In some embodiments, the pair of "L-like" patterns are in mirror symmetry with one another. However, those skilled in the art may modify the top view shapes of the insulating cores 108a and 108b according to design requirements, the present disclosure is not limited thereto.

Figure 2E:
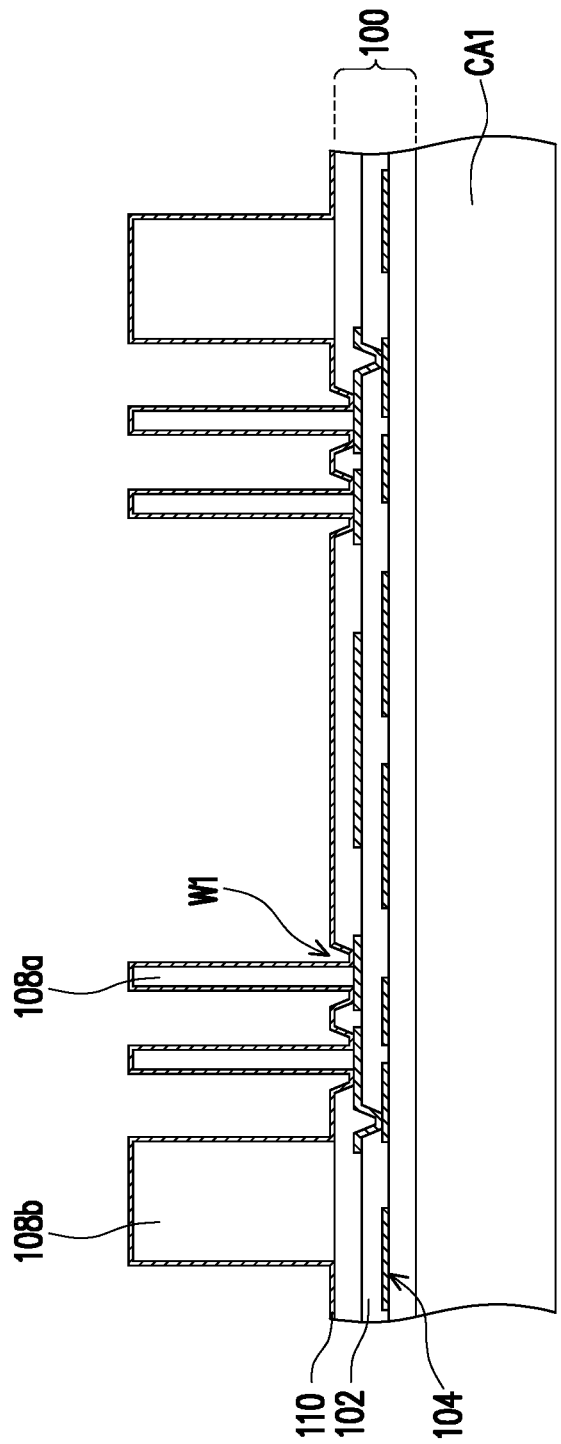

Referring to FIG. 1, FIG. 2D and FIG. 2E, step S108 is performed, and a seed layer 110 is formed over the redistribution structure 100 and the insulating cores 108a and 108b. In some embodiments, the seed layer 110 is conformally formed over the structure shown in FIG. 2D. As such, the front surfaces and sidewalls of the insulating cores 108a and 10b as well as the exposed surface of the redistribution structure 100 are covered by the seed layer 110. In some embodiments, a material of the seed layer 110 includes Ti, Cu, the like or combinations thereof. A thickness of the seed layer 110 may range from 1 Å to 10000 Å. In addition, the seed layer 110 may be formed by, for example, a deposition process, such as a physical vapor deposition (PVD) process.

Figure 2F:
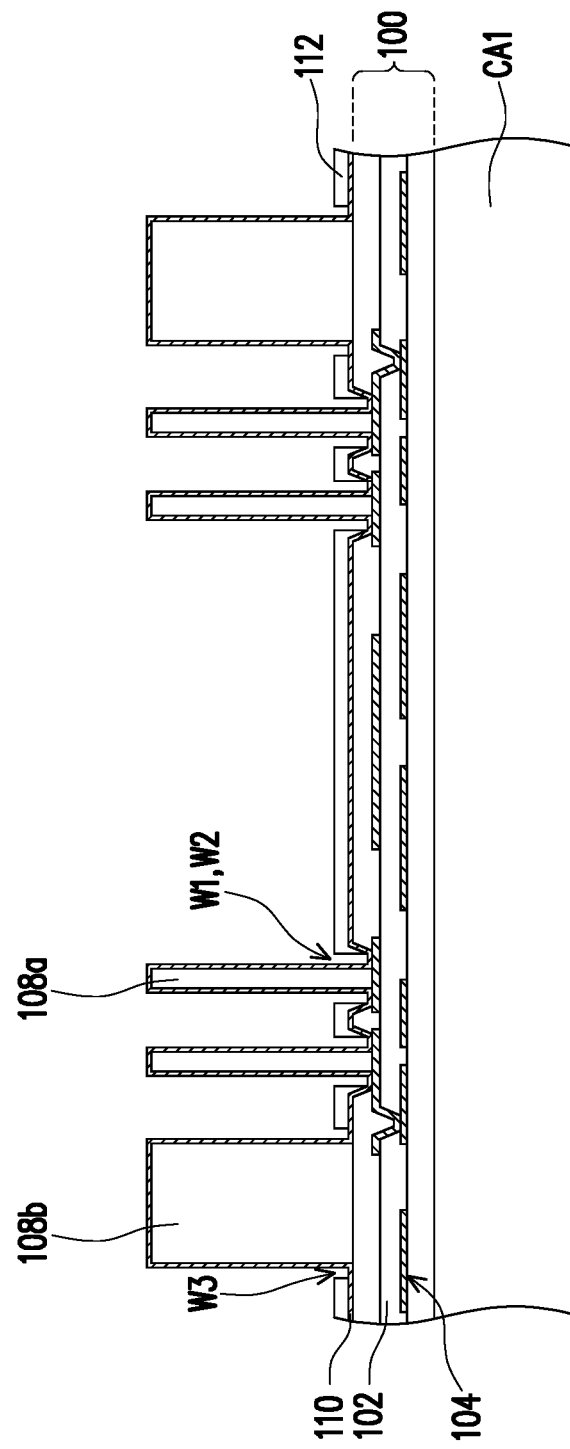
Figure 2G:
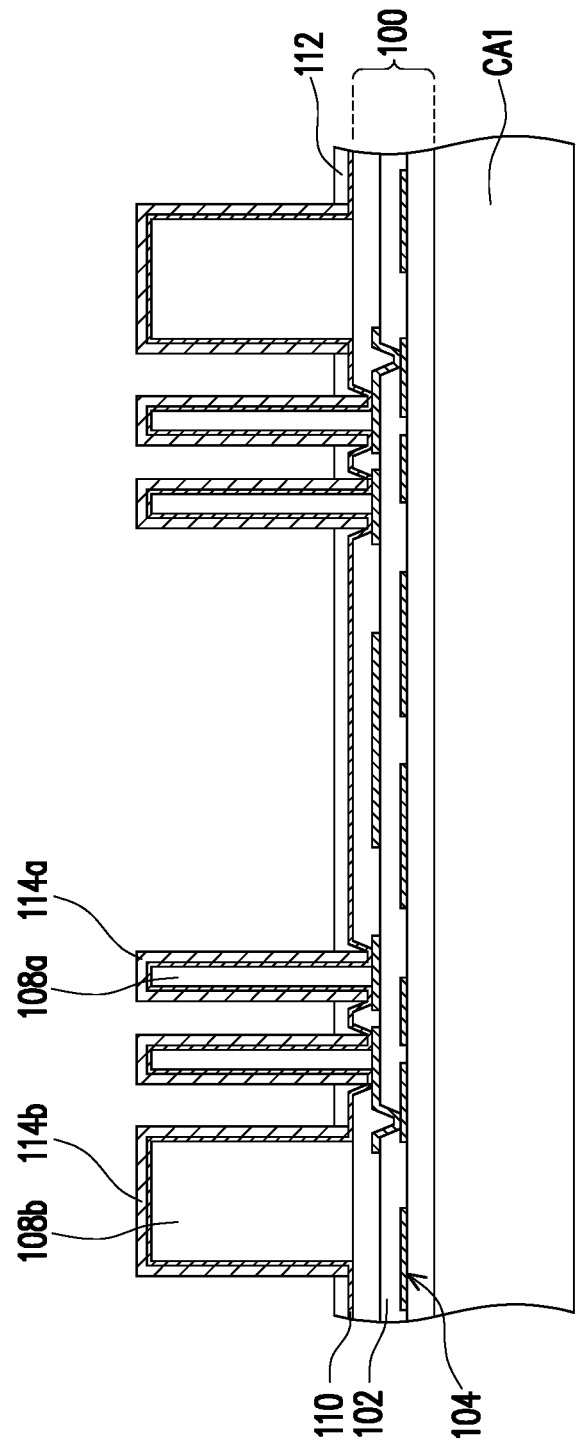
Figure 2H:
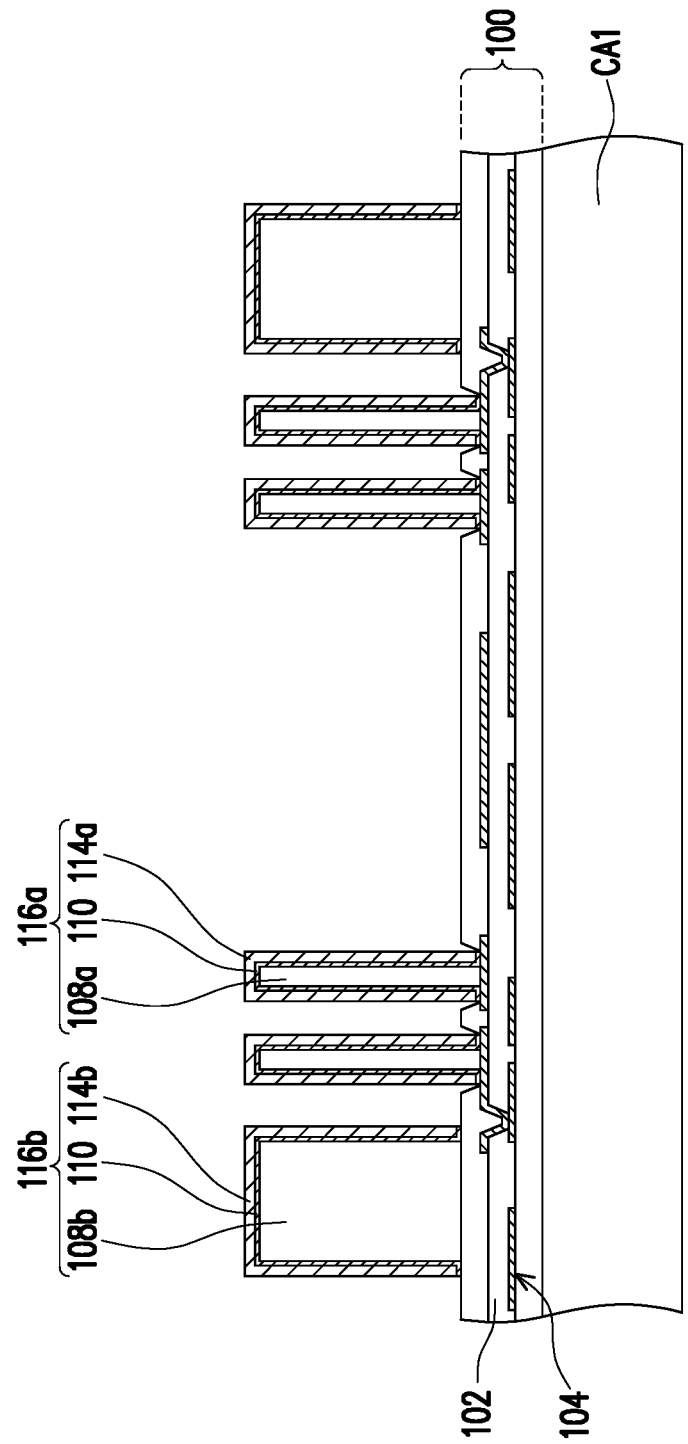
Figure 2I:
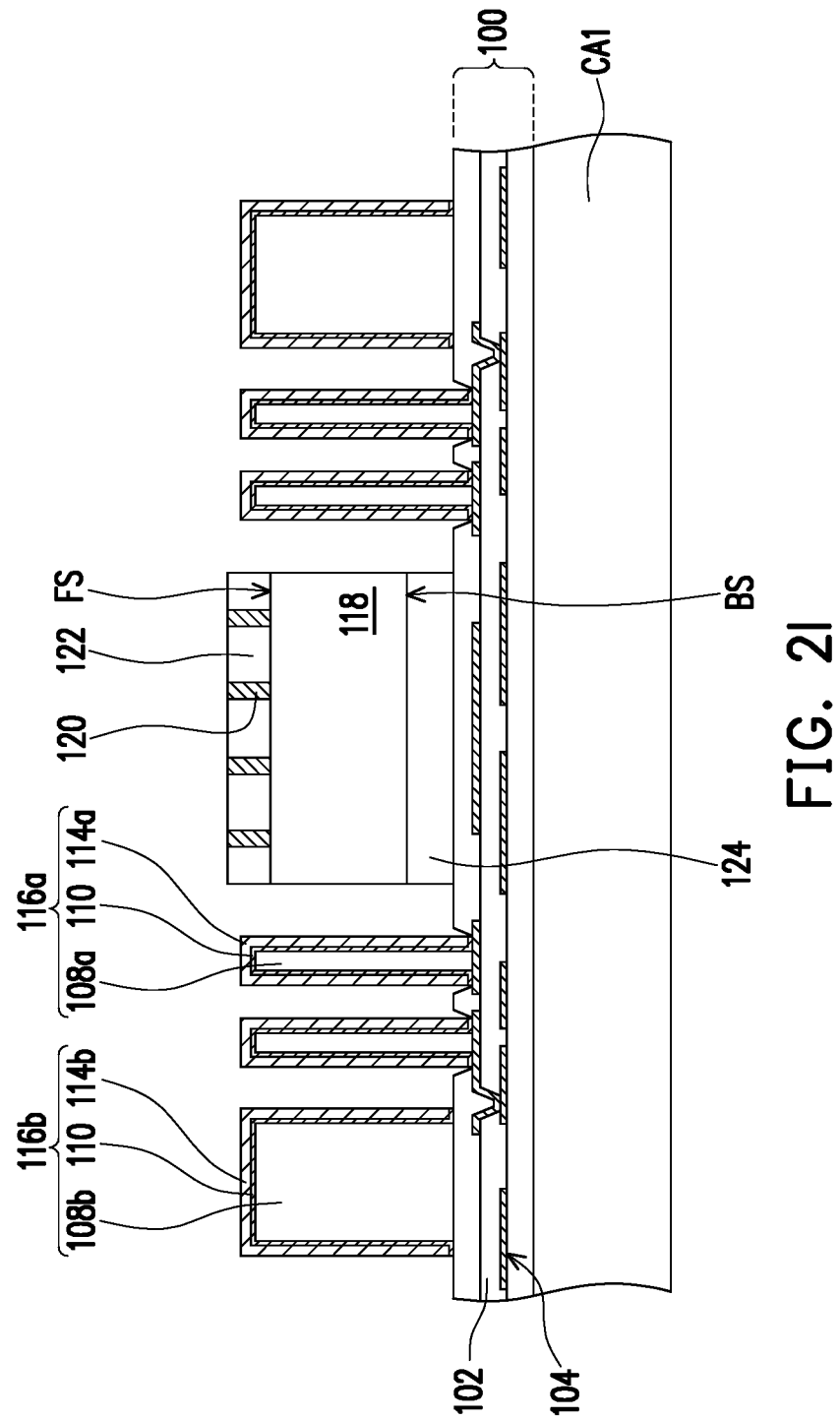

Referring to FIG. 1, FIG. 2E and FIG. 2F, step S110 is performed, and a photoresist pattern 112 is formed over the seed layer 110. The photoresist pattern 112 has openings W2 and openings W3. The openings W2 are respectively overlapped with the openings W1 of the frontmost dielectric layer 102 in the redistribution structure 100, and the insulating cores 108a with the covering portions of the seed layer 110 are respectively located within the spans of the openings W2. A coverage area of the insulating core 108a with the covering portion of the seed layer 110 is smaller than an area of the opening W2 and the area of the opening W1. In addition, boundaries of the opening W2 and the underlying opening W1 are not in contact with a vertical portion of the seed layer 110 covering the sidewall of the insulating core 108a, such that a portion of the insulating core 108a below a front surface (i.e., a top surface in FIG. 2F) of the photoresist pattern 112 could be covered by the conductive layer 114a in the following step (as shown in FIG. 2G). On the other hand, the insulating cores 108b with the covering portions of the seed layer 110 are respectively located within the spans of the openings W3. A coverage area of the insulating core 108b with the covering portion of the seed layer 110 is smaller than an area of the opening W3. In addition, a boundary of the opening W3 is not in contact with a vertical portion of the seed layer 110 covering the sidewall of the insulating core 108b, such that a portion of the insulating core 108b below the front surface of the photoresist pattern 112 could be covered by the conductive layer 114b formed in the following step (as shown in FIG. 2G).

Referring to FIG. 1, FIG. 2F and FIG. 2G, step S112 is performed, and conductive layers 114a and 114b are formed over the exposed portions of the seed layer 110. The insulating cores 108a with the covering portions of the seed layer 110 are respectively covered by the conductive layers 114a. As such, the front surfaces (i.e., the top surfaces in FIG. 2G) and the sidewalls of the insulating cores 108a are covered by the conductive layers 114a. Since the front surfaces of the insulating cores 108a are substantially flat, portions of the seed layers 110 and the conductive layers 114a lying over the front surfaces of the insulating cores 108a can have substantially flat surfaces as well. In some embodiments, a space between the vertical portion of the seed layer 110 covering the sidewall of the insulating core 108a and the boundaries of the openings W1 and W2 is currently filled by the conductive layer 114a. In these embodiments, a portion of the seed layer 110 lying on a bottom surface of the opening W1 is covered by the conductive layer 114a. On the other hand, the insulating cores 108b with the covering portions of the seed layer 110 are respectively covered by the conductive layers 114b. In this way, the front surfaces (i.e., the top surfaces in FIG. 2G) and the sidewalls of the insulating cores 108b are covered by the conductive layers 114b. Since the front surfaces of the insulating cores 108b are substantially flat, portions of the seed layers 110 and the conductive layers 114b lying over the front surfaces of the insulating cores 108b can have substantially flat surfaces as well. In some embodiments, a space between the vertical portion of the seed layer 110 covering the sidewall of the insulating core 108b and the boundary of the opening W3 is currently filled by the conductive layer 114b, and a portion of the seed layer 110 lying on a bottom surface of the opening W3 is covered by the conductive layer 114b. In some embodiments, the conductive layers 114a and 114b are formed in the same step, and may be formed with the same material and substantial the same thickness. In these embodiments, the front surfaces of the conductive layers 114a and 114b (i.e., the top surfaces of the conductive layers 114a and 114b as shown in FIG. 2G) are substantially coplanar with one another. For instance, the thickness of the conductive layers 114a and 114b may range from 10 μm to 30 μm. A material of the conductive layers 114a and 114b may include Cu, Al, Ti, Ni, the like or combinations thereof. In addition, a formation method of the conductive layers 114a and 114b may include a plating process or a deposition process. For instance, the plating process may be an electroplating process or an electro-less plating process, whereas the deposition process may be a PVD process.

Referring to FIG. 1, FIG. 2G and FIG. 2H, step S114 is performed, and the photoresist pattern 112 and the underlying portions of the seed layer 110 are removed. That is, the portions of the seed layer 110 that are not covered by the conductive layers 114a or 114b are removed along with the photoresist pattern 112. After removing the photoresist pattern 112 and the underlying portions of the seed layer 110, some portions of the front surface of the redistribution structure 100 (i.e. the top surface of the redistribution structure 100 as shown in FIG. 2H) are exposed, and portions of the conductive layers 114a and 114b that were located in the openings W2 and W3 of the photoresist pattern 112 are currently exposed. In some embodiments, a method for removing the photoresist pattern 112 and the underlying portion of the seed layer 110 includes a stripping process, an etching process or a combination thereof. The insulating core 108a, the covering portion of the seed layer 110 and the conductive layer 114a lying over this portion of the seed layer 110 are collectively referred as a through via structure 116a, whereas the insulating core 108b, the covering portion of the seed layer 110 and the conductive layer 114b lying over this portion of the seed layer 110 are collectively referred as a dipole structure 116b. The through via structures 116a and the dipole structures 116b have substantially flat front surfaces (i.e., top surfaces in FIG. 2H), and the front surfaces of the through via structures 116a and the dipole structures 116b are substantially coplanar with one another. On the other hand, back sides of the through via structures 116a (i.e., bottom sides of the through via structures 116a as shown in FIG. 2H) extend into the redistribution structure 100, whereas back sides of the dipole structures 116b (i.e., bottom sides of the dipole structures 116b as shown in FIG. 2H) are in contact with the front surface of the redistribution structure 100 (i.e., the top surface of the redistribution structure 100 as shown in FIG. 2H) from above. The insulating core 108a and the insulating core 108b are body portions of the through via structure 116a and the dipole structure 116b, whereas the conductive layer 114a and the conductive layer 114b may be regarded as skin portions (or shell portions) of the through via structure 116a and the dipole structure 116b. Thereby, shapes of the through via structure 116a and the dipole structure 116b are mainly determined by the shapes of the insulating core 108a and the insulating core 108b, which are exemplarily illustrated in FIG. 2D.

Referring to FIG. 1, FIG. 2H and FIG. 2I, step S116 is performed, and a semiconductor die 118 is attached onto the redistribution structure 100. The attached semiconductor die 118 is located between the adjacent through via structures 116a that are sufficiently spaced apart from each other. In some embodiment, the semiconductor die 118 is a logic die, a memory die or the like. For instance, the logic die may be a central processing unit (CPU) die, a micro-control unit (MCU) die, an input/output (I/O) die, a baseband (BB) die or an application processor (AP) die, whereas the memory die may be a dynamic random access memory (DRAM) die or a static random access memory (SRAM) die. An integrated circuit including active devices and passive devices (both not shown) may be formed in the semiconductor die 118. For instance, the active devices may include transistor(s), diode(s), the like or combinations thereof, whereas the passive devices may include resistor(s), capacitor(s), inductor(s), the like or combinations thereof. In addition, an interconnection layer (not shown) may be formed in the semiconductor die 118, and the active devices and the passive devices may be interconnected by this interconnection layer. In some embodiments, a plurality of conductive components 120 may be formed at a front surface FS of the semiconductor die 118 (i.e., the top surface of the semiconductor die 118 as shown in FIG. 2I), and may be functioned as I/Os of the semiconductor die 118. For instance, the conductive components 120 may be conductive pillars, such as copper pillars. In addition, the conductive components 120 may be embedded in a passivation layer 122. In some embodiments, front surfaces of the conductive components 120 (i.e., top surfaces of the conductive components 120 as shown in FIG. 2I) are substantially coplanar with a front surface of the passivation layer 122 (i.e., a top surface of the passivation layer 122 as shown in FIG. 2I). In alternative embodiments, the front surfaces of the conductive components 120 are buried in the passivation layer 122. Before attaching the semiconductor die 118 to the redistribution structure 100, an adhesion layer 124 may be formed over a back surface BS of the semiconductor die 118 (i.e., a bottom surface of the semiconductor die 118 as shown in FIG. 2I). As such, the semiconductor die 118 may be attached to the redistribution structure 100 via the adhesion layer 124. For instance, the adhesion layer 124 may be a die attach film (DAF). In some embodiments, after the semiconductor die 118 with the adhesion layer 124 is attached to the redistribution structure 100, the front surface of the passivation layer 122 (or the front surfaces of the passivation layer 122 and the conductive components 120) is higher than the front surfaces of the through via structures 116a and the dipole structures 116b.

Figure 2J:
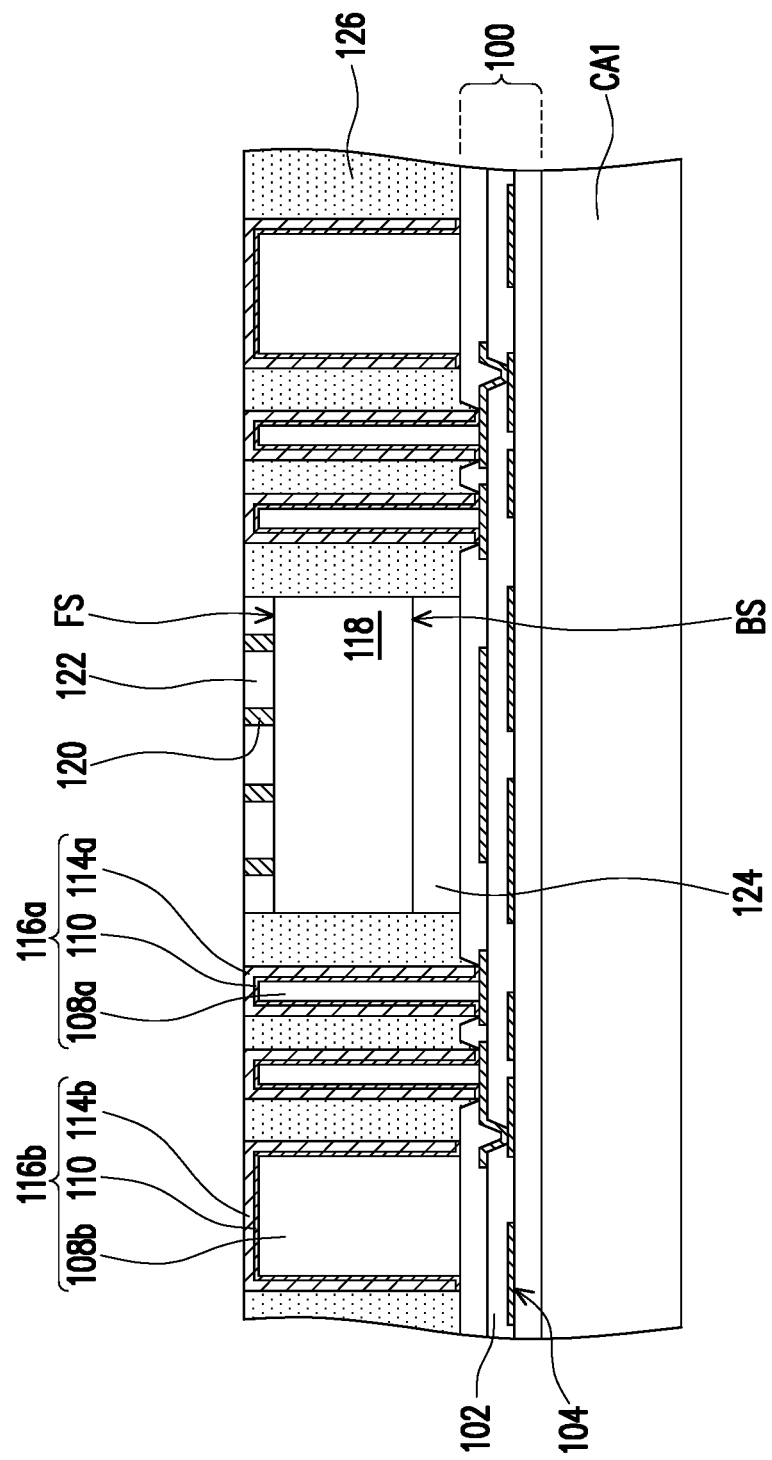

Referring to FIG. 1, FIG. 2I and FIG. 2J, step S118 is performed, and the thorough via structures 116a, the dipole structures 116b and the semiconductor die 118 with the adhesion layer 124 are laterally encapsulated by an encapsulant 126. In some embodiments, the structures over the redistribution structure 100 are over molded by an initial encapsulant (not shown), then a planarization process may performed on the initial encapsulant, so as to form the encapsulant 126. For instance, the planarization process may be a chemical mechanical polishing (CMP) process, an etching process or a grinding process. During the planarization process, a portion of the passivation layer 122 and portions of the conductive components 120 may be removed. As such, the front surfaces of the passivation layer 122 and the conductive components 120 may be substantially coplanar with the front surface of the encapsulant 126. In addition, capping portions of the conductive layers 114a and 114b covering the front surfaces of the insulating cores 108a and 108b may be functioned as stopping layers during the planarization process. In this way, the surfaces of the capping portions of the conductive layers 114a and 114b may be substantially coplanar with the front surfaces of the encapsulant 126, the passivation layer 122 and the conductive components 120. On the other hand, the back surfaces of the dipole structures 116b and the adhesion layer 124 may be substantially coplanar with a back surface of the encapsulant 126 (i.e., a bottom surface of the encapsulant 126), whereas the through via structures 116a may be protruded from the back surface of the encapsulant 126 into the redistribution structure 100.

In alternative embodiments, a method for forming the encapsulant 126 does not include a planarization process, and an encapsulant material for forming the encapsulant 126 is dispensed up to an eventual height of the encapsulant 126.

Figure 2K:
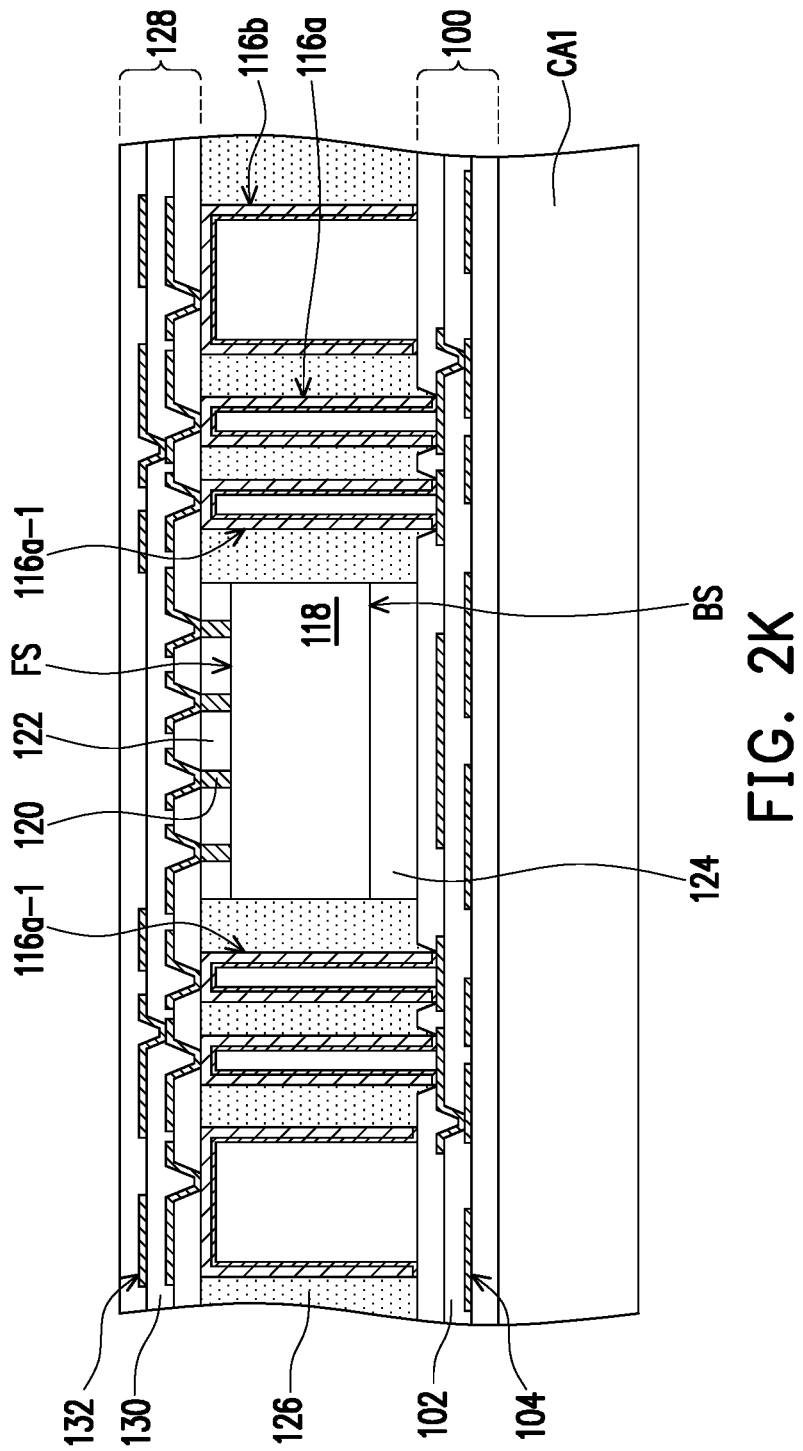

Referring to FIG. 1, FIG. 2J and FIG. 2K, step S120 is performed, and a front redistribution structure 128 is formed over the current reconstructed wafer structure shown in FIG. 2J. In this way, the front surfaces of the encapsulant 126, the through via structures 116a, the dipole structures 116b, the passivation layer 122 and the conductive components 120 are covered by the redistribution structure 128. In addition, since the front surface FS of the semiconductor die 118 faces toward the redistribution structure 128, the redistribution structure 128 may also be referred as a front redistribution structure. In some embodiments, the redistribution structure 128 includes a stack of dielectric layers 130 and redistribution elements 132 formed in the stack of dielectric layers 130. Although three dielectric layers 130 are depicted in FIG. 2K, those skilled in the art may adjust the amount of the dielectric layers 130 in the redistribution structure 128, the present disclosure is not limited thereto. Materials of the dielectric layers 130 may include polymer or other insulating materials. For instance, the dielectric layers 130 may be respectively formed with polyimide, polybenzoxazole, benzocyclobuten, silicones, acrylates, epoxy or combinations thereof. In addition, a thickness of each dielectric layer 130 may range from 2 µm to 10 µm. On the other hand, the redistribution elements 132 may include conductive vias, conductive traces, the like or combinations thereof, and may be formed of conductive materials, such as Cu, Al, Ti, Ni, the like or combinations thereof. The redistribution elements 132 are electrically connected with the semiconductor die 118 through the conductive components 120, and the I/Os of the semiconductor die 188 (e.g., the conductive components 120) can be out routed to the span of the redistribution structure 128. Furthermore, the redistribution elements 132 are electrically connected with the through via structures 116a and the dipole structures 116b. As such, the semiconductor die 118 may be electrically connected with at least some of the through via structures 116a and the dipole structures 116b through the redistribution elements 132. In some embodiments, the through via structures 116a that are closest to the semiconductor die 118 may not be electrically connected with the semiconductor die 118, and may receive a reference voltage (e.g., a ground voltage), so as to be functioned as electromagnetic shielding structures for blocking electromagnetic interference on the semiconductor die 118. In some embodiments, some the through via structures 116a that are closest to the semiconductor die 118 (which are referred as through via structures 116a-1) may receive the reference voltage through the redistribution structure 100 and/or the redistribution structure 128, and may be functioned as a electromagnetic shielding structure for the semiconductor die 118.

Figure 2L:
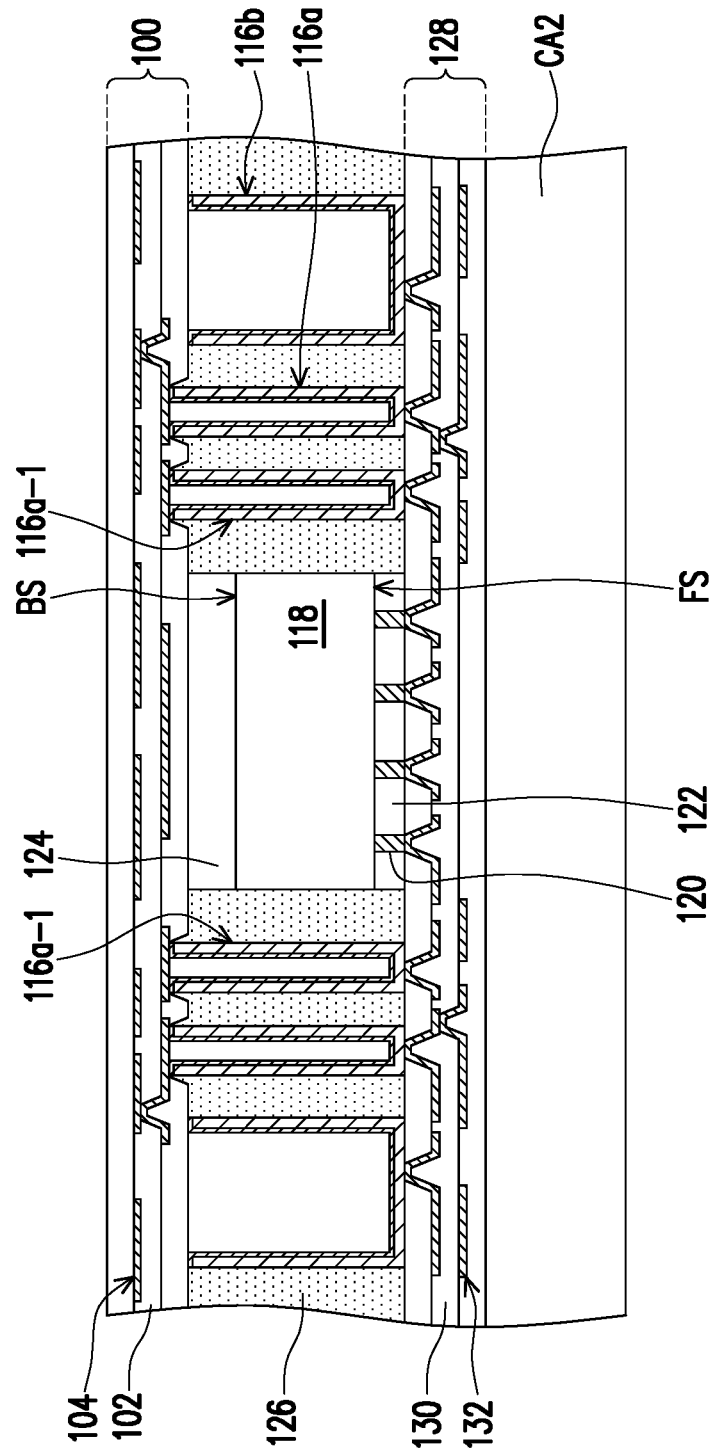

Referring to FIG. 1, FIG. 2K and FIG. 2L, step S122 is performed, and a second carrier CA2 is attached to the redistribution structure 128 at the front side (i.e., the bottom side in FIG. 2L) of the package structure, and the first carrier CA1 is detached from the redistribution structure 100 at a back side (i.e., the top side in FIG. 2L) of the package structure. In some embodiments, the structure shown in FIG. 2K is flipped over, and then the second carrier CA2 is attached to the redistribution structure 128 at the front side (i.e., the bottom side in FIG. 2L) of the package structure. Thereafter, the first carrier CA1 is detached from the redistribution structure 100 at the rear side (i.e., the top side in FIG. 2L) of the package structure. As such, a surface of the redistribution structure 100 that is opposite to the semiconductor die 118 is exposed.

Figure 2M:
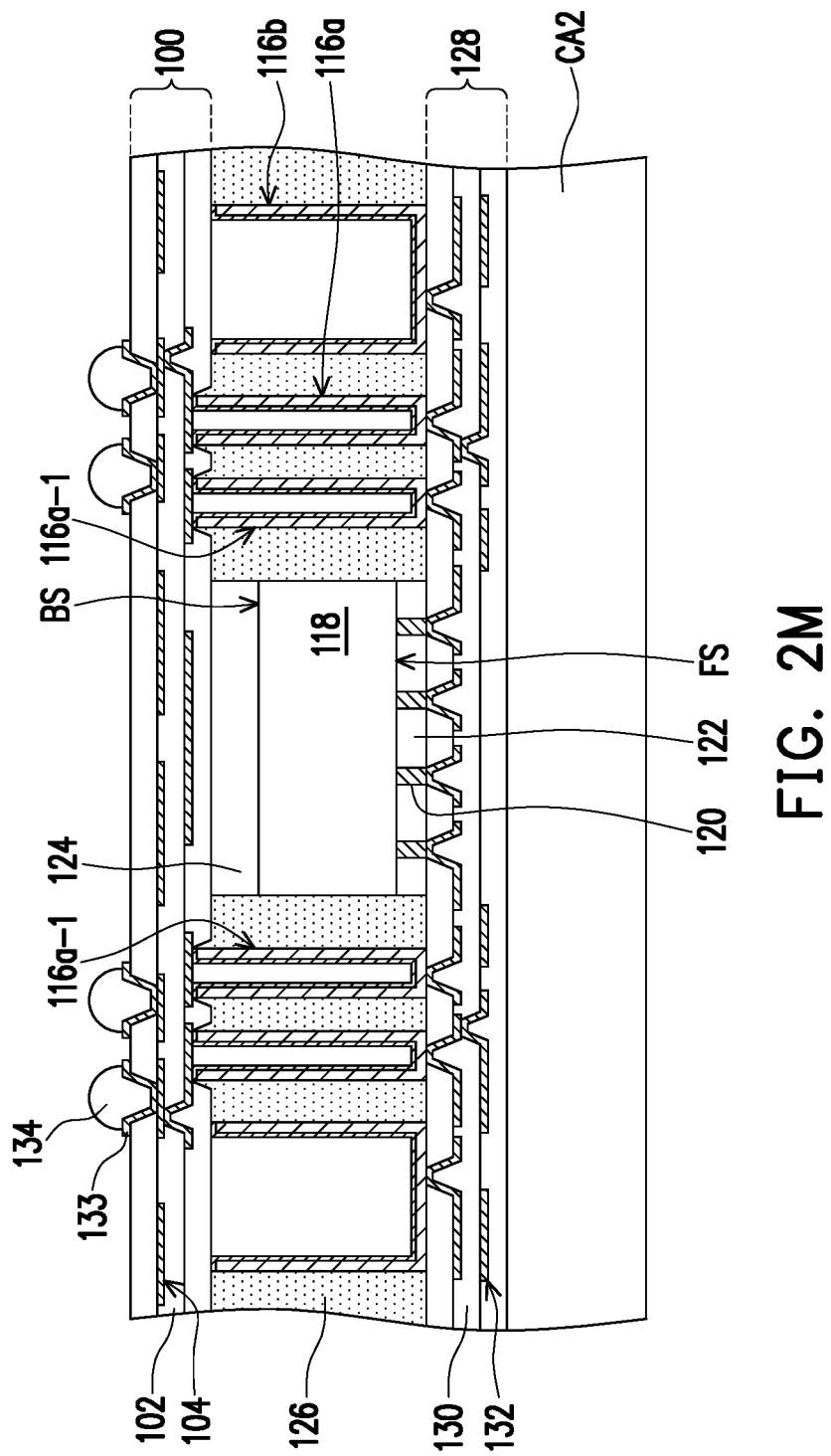
Figure 2N:
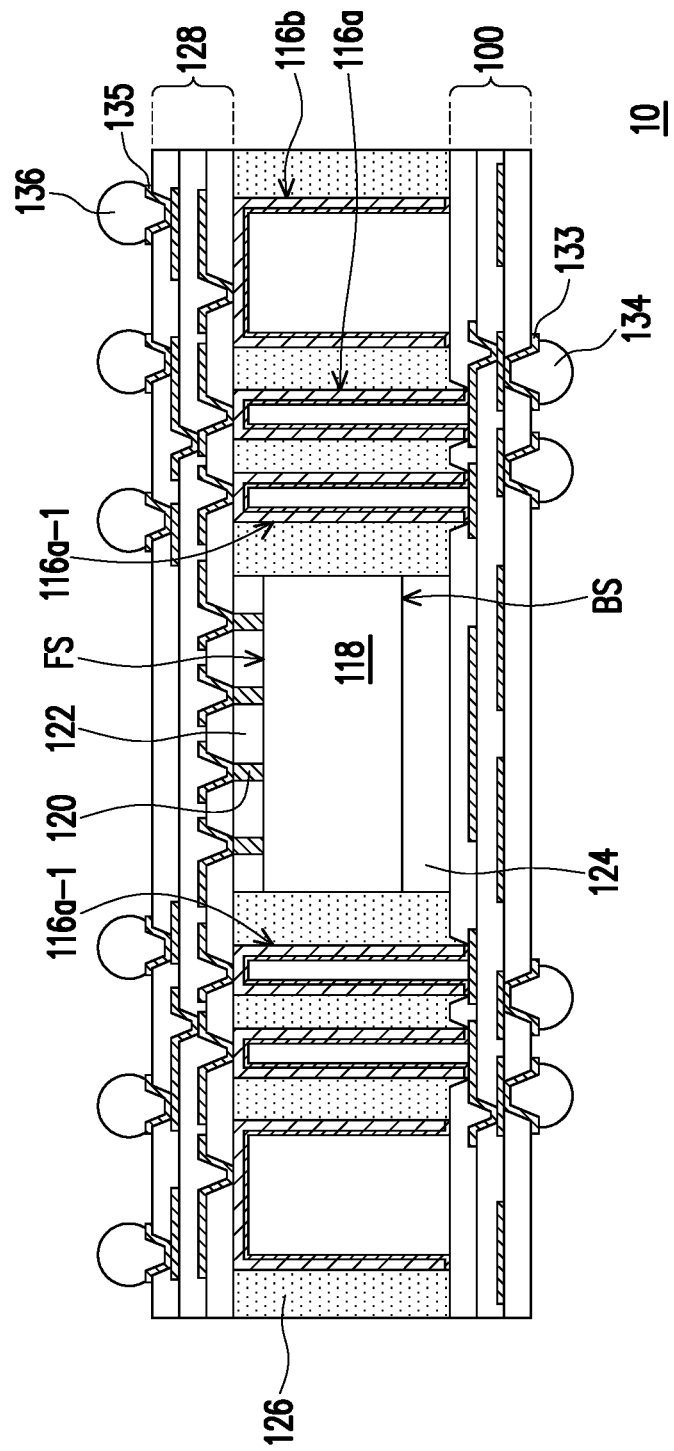

Referring to FIG. 1, FIG. 2L and FIG. 2M, step S124 is performed, and electrical connectors 134 are formed over the redistribution structure 100. In some embodiments, the electrical connectors 134 include micro-bumps, controlled collapse chip connection (C4) bumps, ball grid array (BGA) balls, solder balls or the like. A method for forming the electrical connectors 134 may include removing some portions of the rearmost dielectric layer(s) 102 (i.e., the topmost dielectric layer(s) 102 as shown in FIG. 2M) to form openings in this dielectric layer(s) 102. Theses openings in the rearmost dielectric layer(s) 102 may expose some of the redistribution elements 104. Thereafter, the electrical connectors 134 may be formed in these openings of the rearmost dielectric layer(s) 102, and may be electrically connected with the exposed redistribution elements 104. In some embodiments, before forming the electrical connectors 134, under ball metallization (UBM) layers 133 may be formed in these openings of the rearmost dielectric layer(s) 102. For instance, a material of the UBM layer 133 may include Cr, Cu, Ti, W, Ni, Al, the like or combinations thereof.

Referring to FIG. 1, FIG. 2M and FIG. 2N, step S126 is performed, such that the second carrier CA2 is detached from the redistribution structure 128 at the front side (i.e., the top side in FIG. 2N) of the package structure, and electrical connectors 136 are formed over the redistribution structure 128. In some embodiments, before detaching the second carrier CA2 and forming the electrical connectors 136, the structure shown in FIG. 2N may be flipped over, and the electrical connectors 134 at the back side (i.e., the bottom side in FIG. 2N) of the current package structure may be attached to a tape (not shown). After the electrical connectors 134 at the back side (i.e., the bottom side in FIG. 2N) of the package structure are attached with the tape, the electrical connectors 136 are formed over the redistribution structure 128 at the front side (i.e., the top side in FIG. 2N) of the package structure. In some embodiments, the electrical connectors 136 include micro-bumps, controlled collapse chip connection (C4) bumps, ball grid array (BGA) balls, solder balls or the like. A method for forming the electrical connectors 136 may include removing some portions of the frontmost dielectric layer(s) 130 (i.e., the topmost dielectric layer(s) 130 as shown in FIG. 2N) to form openings in this dielectric layer(s) 130. These openings in the frontmost dielectric layer(s) 130 may expose some of the redistribution elements 132. Thereafter, the electrical connectors 136 may be formed in these openings of the frontmost dielectric layer(s) 130, and may be electrically connected with the exposed redistribution elements 132. In some embodiments, before forming the electrical connectors 136, UBM layers 135 may be formed in these openings of the frontmost dielectric layer(s) 130. For instance, a material of the UBM layer 135 may include Cr, Cu, Ti, W, Ni, Al, the like or combinations thereof. Furthermore, after forming the electrical connectors 136, a singulation process may be performed on the current structure, and the tape attached to the electrical connectors 134 may be removed.

Up to here, a semiconductor package 10 of some embodiments in the present disclosure is formed. The semiconductor die 118, the through via structures 116a and the dipole structures 116b are laterally encapsulated by the encapsulant 126. The through via structures 116a may be functioned to transmit signals between a front side and a back side of the semiconductor die 118. The dipole structures 116b may be functioned as antennas that may transmit signals from the semiconductor die 118 to an external component, or to receive signals from the external component and send to the semiconductor die 118. The through via structures 116a and the dipole structures 116b respectively have an insulating core (i.e., the insulating cores 108a and the insulating cores 108b as labeled in FIG. 2J) and a conductive layer covering the insulating core (i.e., the conductive layers 114a and the conductive layers 114b as labeled in FIG. 2J). The front surfaces of the insulting cores of the through via structures 116a and the dipole structures 116b (i.e., the insulating cores 108a and 108b as labeled in FIG. 2J) are substantially flat, and are substantially coplanar with one another. Accordingly, the capping portions of the conductive layers covering the front surfaces of the insulating cores (i.e., the conductive layers 114a and 114b as labeled in FIG. 2J) have substantially flat surfaces as well, and are substantially coplanar with each other. In other words, height variation among the through via structures 116a and the dipole structures 116b is significantly reduced. Therefore, the through via structures 116a and/or the dipole structures 116b are much less likely to be recessed from the front surface of the encapsulant 126, thus fails on electrical connection between the through via structures 116a/dipole structures 116b and the components formed thereon (e.g., the redistribution structure 128) can be effectively avoided. Furthermore, since the front surfaces of the through via structures 116a and the dipole structures 116b are substantially flat, dome structures are absent at top portions of the through via structures 116a. Thereby, problem of dome vertices offset would not occur, and the through via structures 116a can be functioned as reliable alignment references during a die placing process.

Figure 3A:
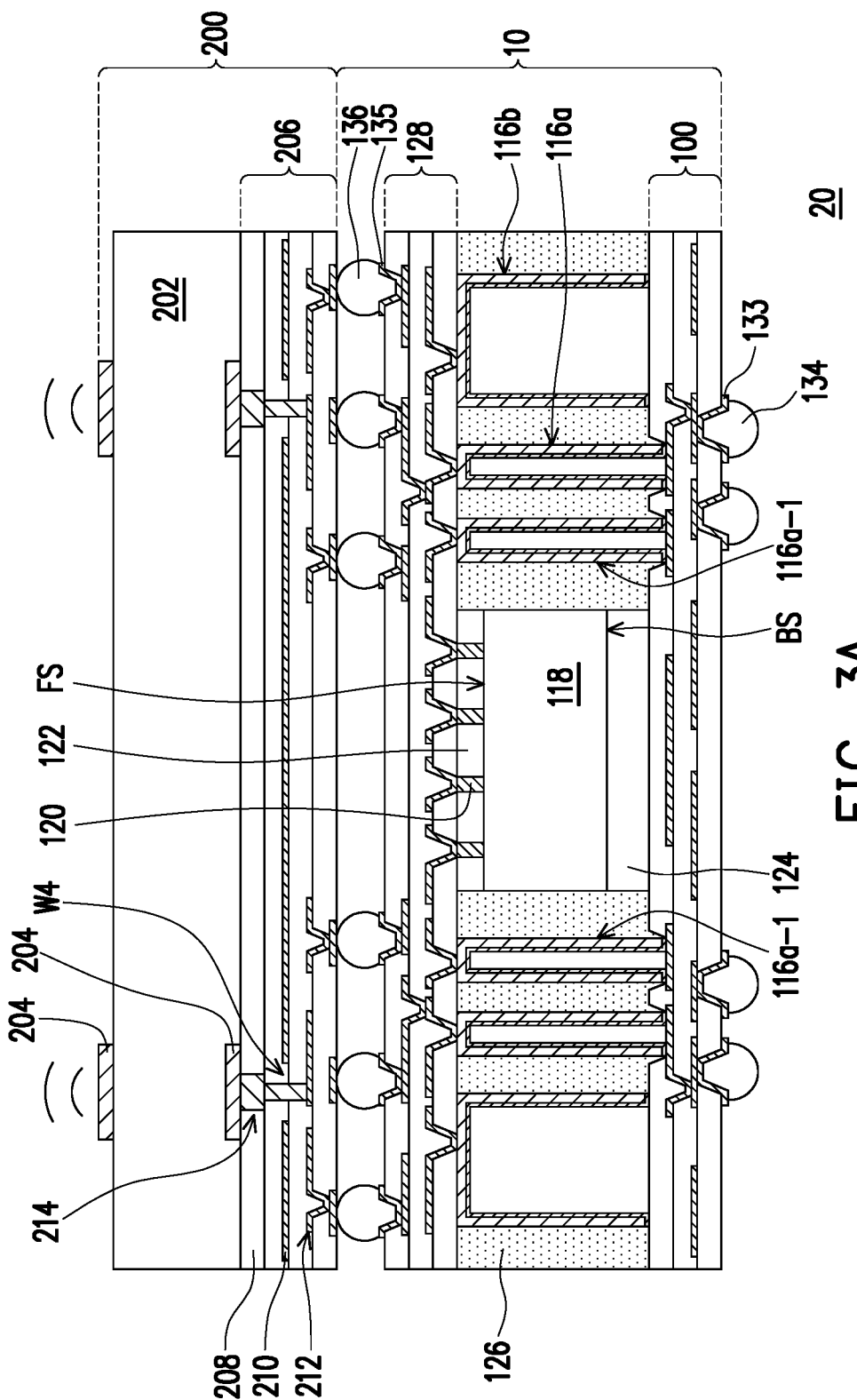
FIG. 3A is a cross-sectional view illustrating a semiconductor package according to some embodiments of the present disclosure.
Figure 3B:
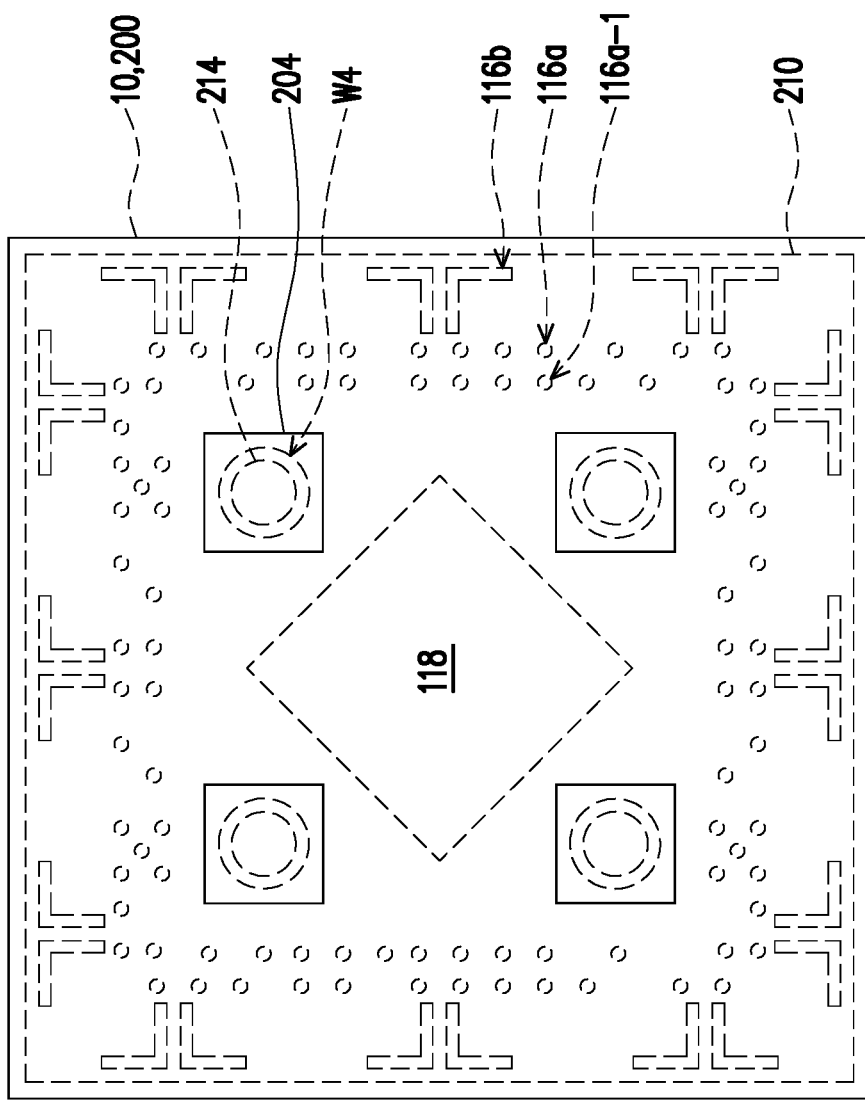
FIG. 3B is an exemplary top view of the semiconductor package shown in FIG. 3A.

FIG. 3A is a cross-sectional view illustrating a semiconductor package 20 according to some embodiments of the present disclosure. FIG. 3B is an exemplary top view of the semiconductor package shown in FIG. 3A.

Referring to FIG. 2N and FIG. 3A, the semiconductor package 20 shown in FIG. 3 can be regarded as a stacking structure including the semiconductor package 10 shown in FIG. 2N and an antenna package 200 stacked on top of the semiconductor package 10. In some embodiments, the antenna package 200 is attached and electrically connected to the semiconductor die 118 through the electrical connectors 136 and the front redistribution structure 128. In some embodiments, the antenna package 200 includes an antenna die 202. The antenna die 202 may include multiple pairs of patches 204. Each pair of patches 204 are disposed at opposite sides of the antenna die 202, and are overlapped with each other. The patches 204 are conductive, and are functioned to send/receive signals. In some embodiments, one of each pair of patches 204 is embedded in a body portion of the antenna die 202, whereas the other one patch 204 is disposed on the body portion of the antenna die 202. For instance, bottom ones of the patches 204 are embedded in the body portion of the antenna die 202, whereas top ones of the patches 204 are disposed over the body portion. Moreover, the antenna package 200 further includes an interconnection structure 206 formed at a surface of the antenna die 202 that is facing toward the semiconductor package 10 (e.g., a bottom surface of the antenna die 202 as shown in FIG. 3A). In some embodiments, the interconnection structure 206 includes a stack of dielectric layers 208, a ground plane 210, feed lines 212 and through vias 214. The ground plane 210 is formed in one of the dielectric layers 208, and may be configured to receive a reference voltage (e.g. a ground voltage). The ground plane 210 is a blanket conductive layer, and has openings W4. In some embodiments, the ground plane 210 is overlapped with the underlying semiconductor die 118, the through via structures 116a and the dipole structures 116b. Each opening W4 is overlapped with one of the pairs of patches 204. The feed lines 212 are formed in at least one of the dielectric layers 208 that is/are located at a side of the ground plane 210 opposite to the antenna die 202 (e.g., a bottom side of the ground plane 210 as shown in FIG. 3A). The through via 214 penetrates through the opening W4, and is electrically connected between one of the bottom patches 204 and at least one of the feed lines 212. The feed lines 212 are electrically connected to the I/Os (e.g., the conductive components 120) of the semiconductor die 118 through the electrical connectors 136 and the redistribution structure 128. As such, signals can be transmitted between the antenna die 202 and the semiconductor die 118 through the through vias 214, the feed lines 212, the electrical connectors 136 and the redistribution structure 128.

In some embodiments, the semiconductor package 20 is further attached onto a circuit substrate (not shown). In these embodiments, the circuit substrate may be attached with the electrical connectors 134 at a back side of the semiconductor package 20. For instance, the circuit substrate may be a printed circuit board (PCB).

Referring to FIG. 3A and FIG. 3B, in some embodiments, the semiconductor die 118 is disposed at a central region of the semiconductor package 10, and is surrounded by the through vias 214 and the patches 204 of the overlying antenna package 200. The semiconductor die 118 may not be overlapped with the patches 204, thus electromagnetic interference between the patches 204 and the semiconductor die 118 may be reduced. Further, the through vias 214 and the patches 204 of the antenna package 200 may be surrounded by the through via structures 116a of the underlying semiconductor package 10. In some embodiments, the through via structures 116a are surrounded by the dipole structures 116b in the semiconductor package 10. In this way, the semiconductor die 118, the patches 204 with the through vias 214, the through via structures 116a and the dipole structures 116b may be sequentially arranged from a center of the semiconductor package 20 to an edge of the semiconductor package 20. In some embodiments, as shown in FIG. 3B, top view shapes of the semiconductor die 118 and the patches 204 are both rectangular, and the surrounding through via structures 116a are distributed along a boundary of a rectangle. In addition, the semiconductor die 118 may be regarded as being rotated clockwise or counterclockwise by, for example, around 45° with respect to the patches 204. The patches 204 may be respectively located between an edge of the semiconductor die 118 and the adjacent portion of the through via structures 116a. As such, a the patches 204 of the antenna package 200 may be closer to the center of the semiconductor package 20, and so as the through via structures 116a and the dipole structures 116b of the semiconductor package 10. Accordingly, dimension of the semiconductor package 20 including the semiconductor package 10 and the antenna package 200 may be reduced. However, those skilled in the art may modify the configuration of the elements in the semiconductor package 10 and the antenna package 200 according to design requirements, the present disclosure is not limited thereto.

In the embodiments illustrated with reference to FIG. 3A and FIG. 3B, the semiconductor die 118 may communicate with external components along horizontal and vertical direction respectively through the dipole structures 116b and the antenna die 202.

FIG. 4A through FIG. 4D are cross-sectional views illustrating structures at various stages during a manufacturing method of a semiconductor package 20a according to some embodiments of the present disclosure. The embodiments to be described with reference to FIG. 4A through FIG. 4D are similar to the embodiments illustrate by FIG. 2A through FIG. 2N and FIG. 3A and FIG. 3B. Only the differences therebetween will be discussed, the like or the same parts may not be repeated again.

Figure 4A:
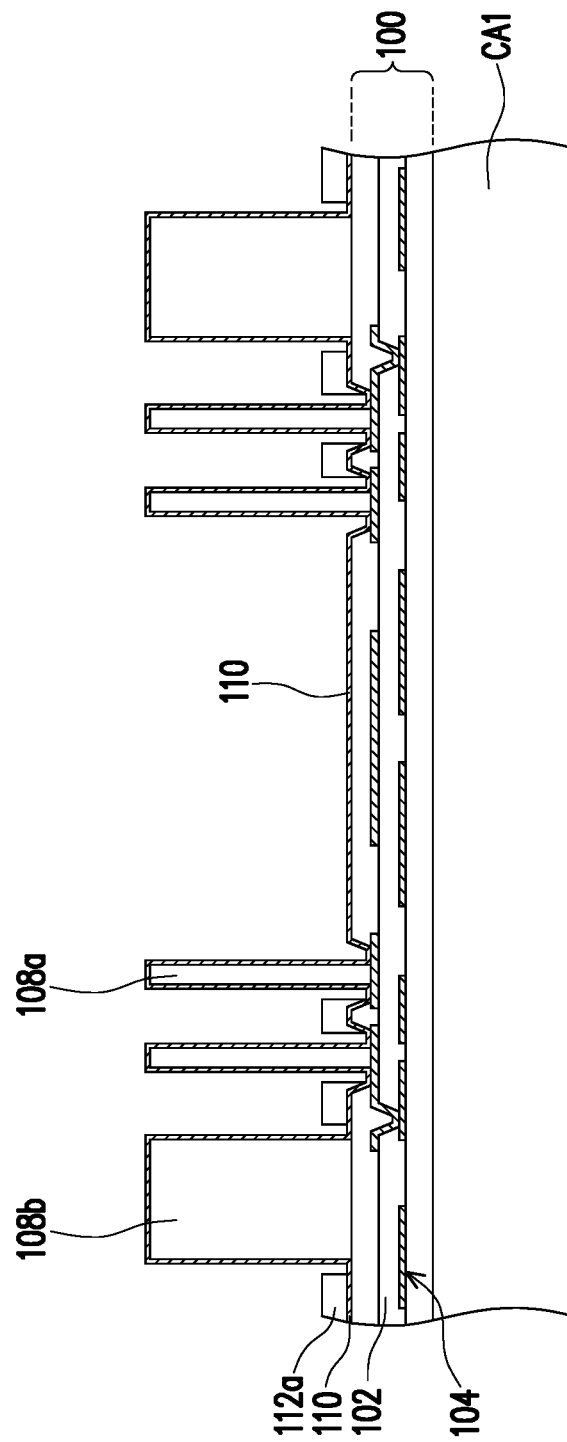
FIG. 4A through FIG. 4D are cross-sectional views illustrating structures at various stages during a manufacturing method of a semiconductor package according to some embodiments of the present disclosure.

Referring to FIG. 1, and FIG. 4A, after step S100 through step S108 (as shown in FIG. 2A through FIG. 2E) have been completed, step S110 is performed, and a photoresist pattern 112a is formed over the seed layer 110. A difference between the photoresist pattern 112a shown in FIG. 4A and the photoresist pattern 112 shown in FIG. 2F lies in that the photoresist pattern 112a exposes a portion of the seed layer 110 on which the semiconductor die 118 is to be attached. In some embodiments, the portion of the seed layer 110 located between those adjacent insulating cores 108a, which are sufficiently spaced apart for accommodating the semiconductor die 118, is completely exposed by the photoresist pattern 112a. In these embodiments, the openings W2 accommodating those sufficiently separated insulating cores 108a may be regarded as merging into a large opening.

Figure 4B:
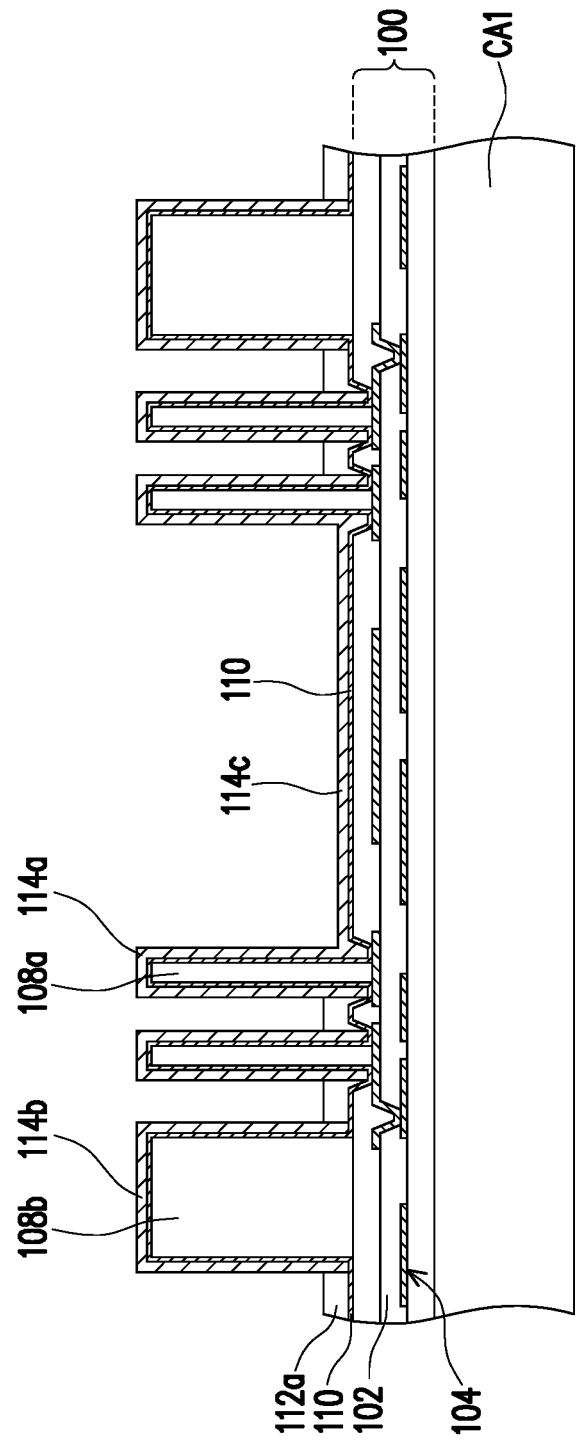

Referring to FIG. 1 and FIG. 4B, step S112 is performed, and the conductive layers 114a, the conductive layers 114b and conductive layer 114c are formed over the exposed portions of the seed layer 110. The conductive layers 114a, 114b and 114c may be regarded as different portions of the same material layer. The insulating cores 108a with the covering portions of the seed layer 110 are respectively covered by the conductive layers 114a, whereas the insulating cores 108b with the covering portions of the seed layer 110 are respectively covered by the conductive layers 114b. In addition, the portion of the seed layer 110 located between those sufficiently separated insulating cores 108a is covered by the conductive layer 114c. In some embodiments, the conductive layer 114c is connected with the adjacent conductive layers 114a.

Figure 4C:
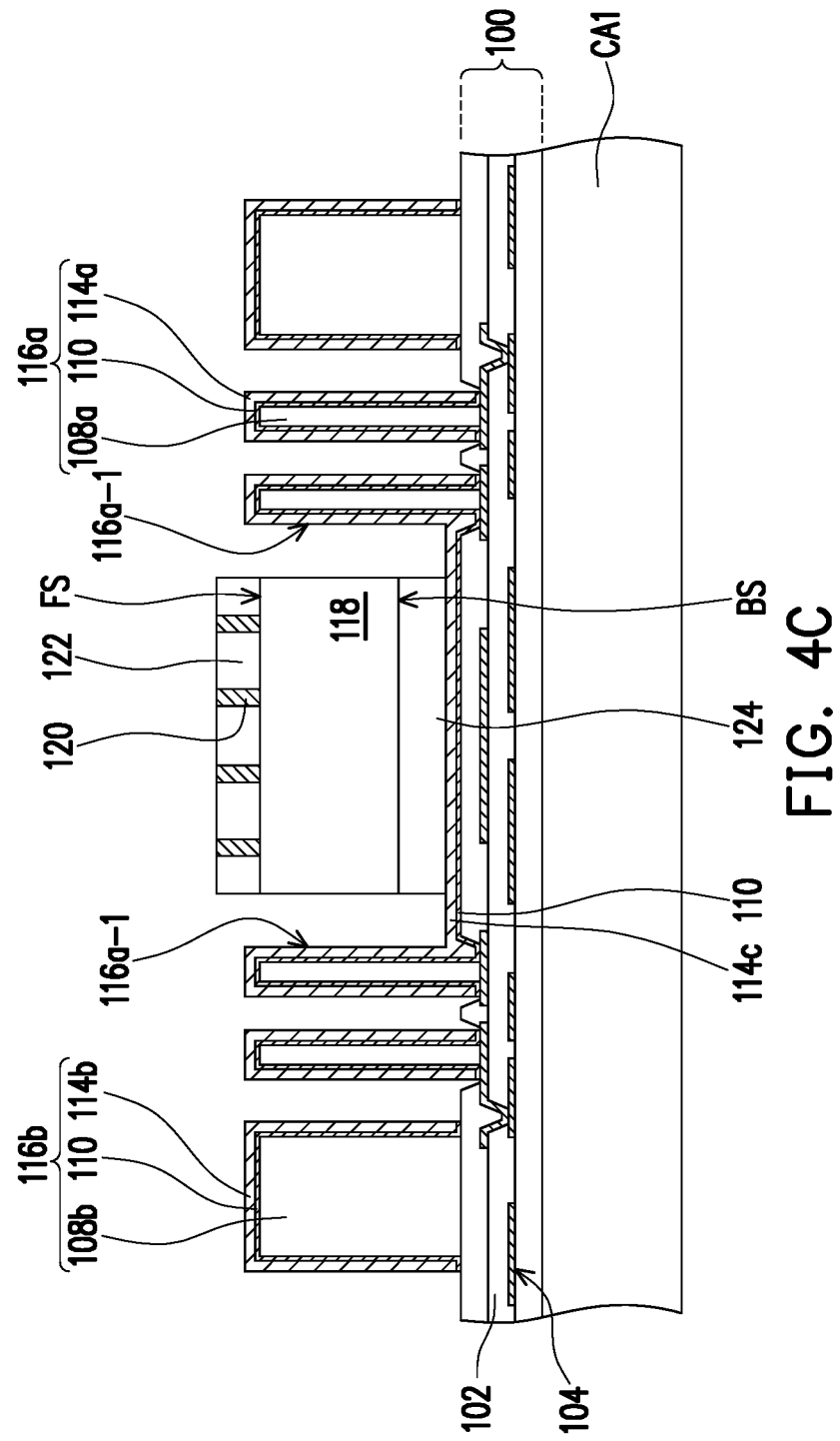

Referring to FIG. 1 and FIG. 4C, after step S114 is completed, step S116 is performed, and the semiconductor die 118 is attached onto conductive layer 114c lying over the redistribution structure 100. In some embodiments, the conductive layer 114c with the underlying portion of the seed layer 110 is connected with some of the through via structures 116a that are closest to the semiconductor die 118 (which are also referred as the through via structures 116a-1), and the through via structures 116a-1 as well as the conductive layer 114 with the underlying portion of the seed layer 110 are configured to receive a reference voltage (e.g., a ground voltage). In these embodiments, the through via structures 116a-1 may be functioned as electromagnetic shielding structures, and the conductive layer 114c with the underlying portion of the seed layer 110 that is connected between these shielding structures 116a-1 may be functioned as an electromagnetic shielding layer. The shielding structures may block the semiconductor die 118 from lateral electromagnetic interference, whereas the shielding layer may block the semiconductor die 118 from electromagnetic interference from below the semiconductor die 118.

Figure 4D:
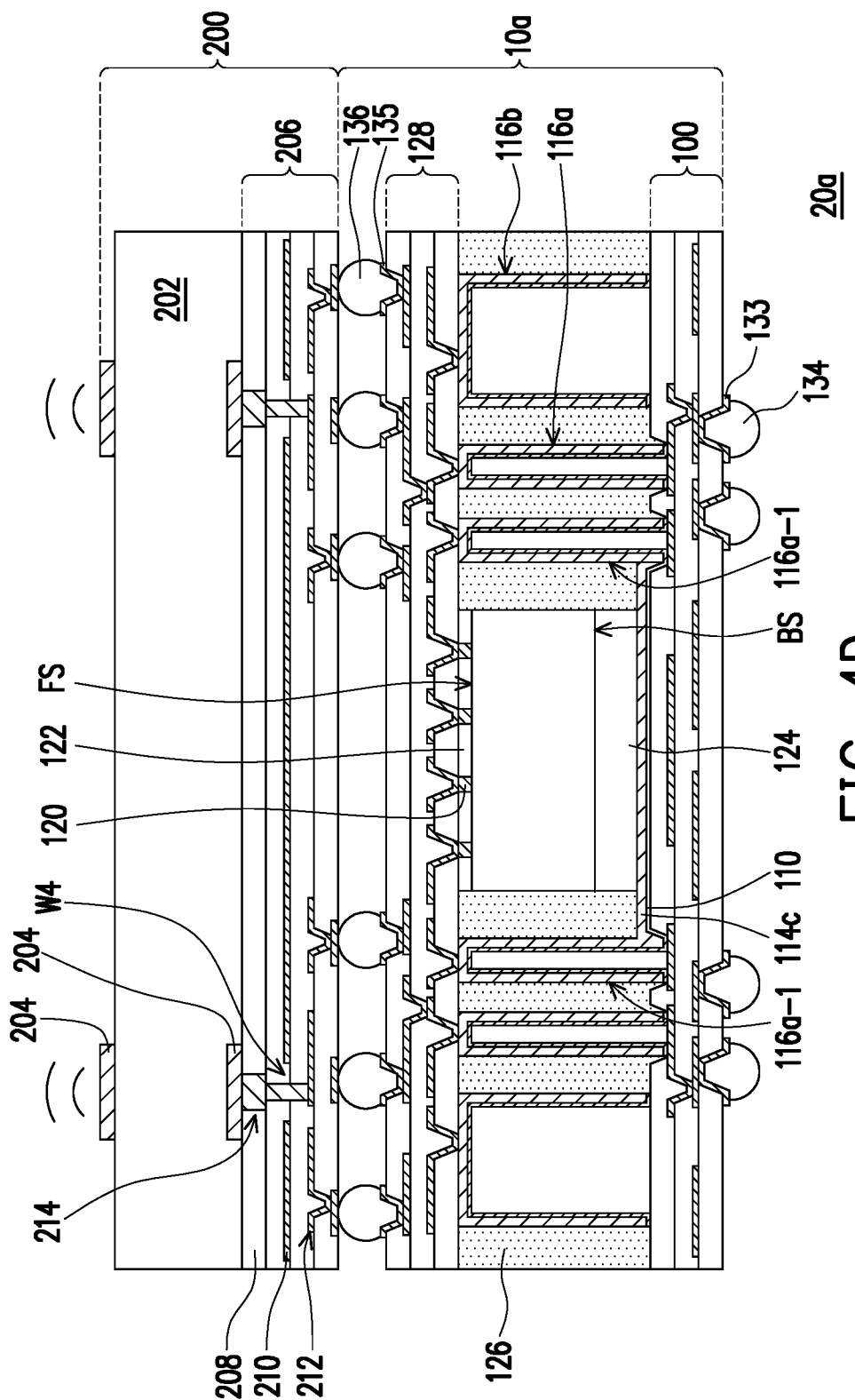

Referring to FIG. 1 and FIG. 4D, after step S118 through step S126 have been completed, a semiconductor package 10a is formed. A difference between the semiconductor package 10a shown in FIG. 4D and the semiconductor package 10 shown in FIG. 2N or FIG. 3A lies in that the semiconductor package 10a further includes the shielding layer containing the conductive layer 114c and the underlying portion of the seed layer 10. The shielding layer is located between the semiconductor die 118 and the redistribution structure 100, and is functioned to provide an electromagnetic shield for the semiconductor die 118. In some embodiments, the antenna package 200 is further attached onto the semiconductor package 10a, so as to form a semiconductor package 20a.

Figure 5:
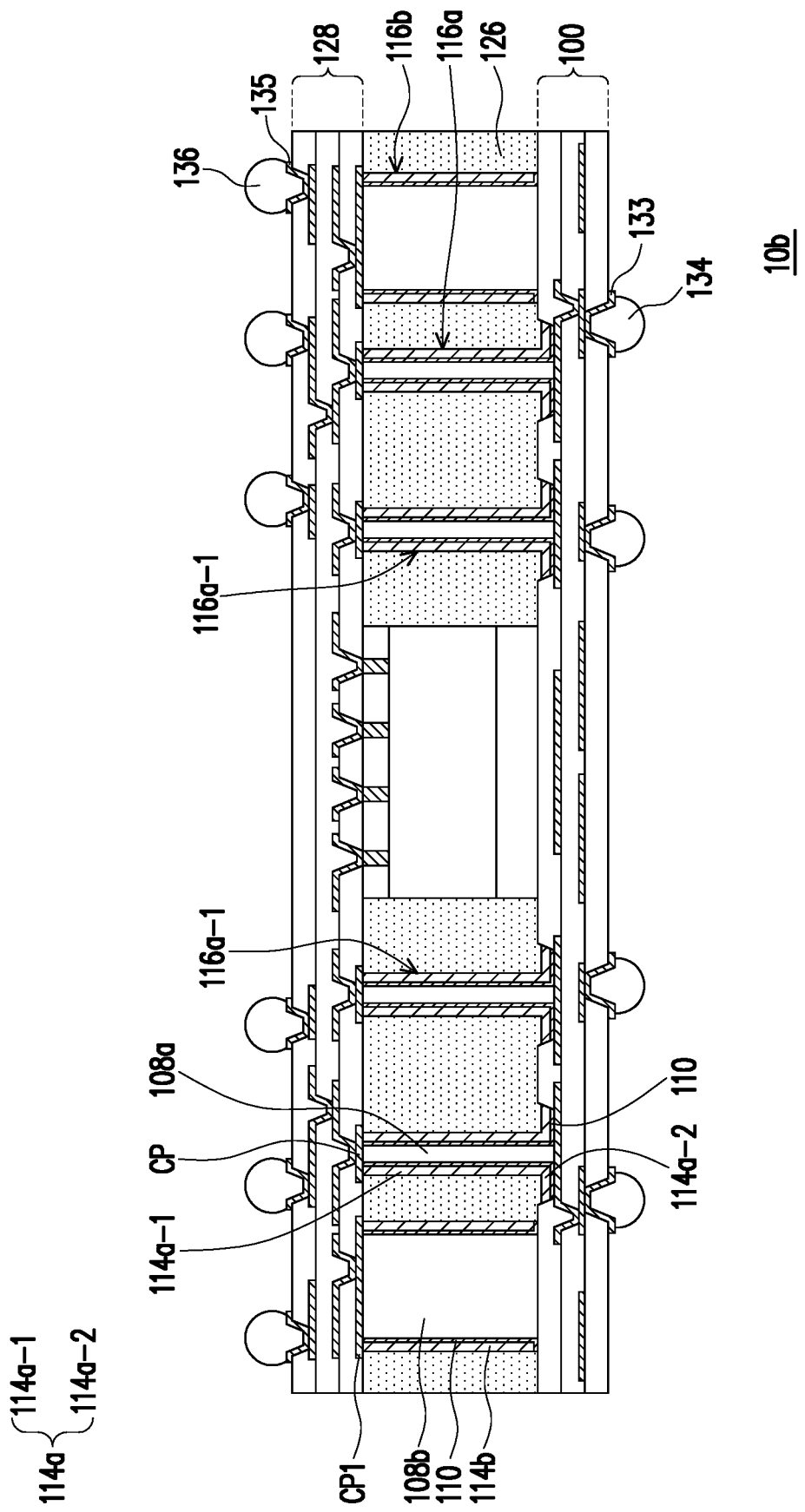
FIG. 5 is a cross-sectional view illustrating a semiconductor package according to some embodiments of the present disclosure.

FIG. 5 is a cross-sectional view illustrating a semiconductor package 10b according to some embodiments of the present disclosure.

Referring to FIG. 2N and FIG. 5, the semiconductor package 10b shown in FIG. 5 is similar to the semiconductor package 10 as shown in FIG. 2N, a difference therebetween lies in that the front surfaces of the insulating cores 108a and 108b (i.e., top surfaces of the insulating cores 108a and 108b as shown in FIG. 5) in the semiconductor package 10b are not covered by the seed layer 110 and the conductive layers 114a and 114b. In other words, the insulating cores 108a and 108b of the through via structures 116a and the dipole structures 116b shown in FIG. 5 may be in direct contact with the overlying elements (e.g., the redistribution structure 128).

As shown in FIG. 5, the sidewall of the insulating core 108a of the through via structure 116a is covered by a portion of the seed layer 110 and the conductive layer 114a, whereas the front surface of the insulating core 108a may not be capped by the seed layer 110 and the conductive layer 114a. In some embodiments, the conductive layer 114a has a vertical portion 114a-1 extending vertically along the sidewall of the insulating core 108a, and further has a horizontal portion 114a-2 extending horizontally from a rear end of the vertical portion 114a-1 (i.e., a bottom end of the vertical portion 114a-1 as shown in FIG. 5). In some embodiments, the horizontal portion 114a-2 with the underlying portion of the seed layer 110 spans within the opening W1. In alternative embodiments, the horizontal portion 114a-2 with the underlying portion of the seed layer 110 extends from the bottom surface of the opening W1 to the front surface of the redistribution structure 100 outside the opening W1. Since the conductive layer 114a further has the horizontal portion 114a-2, contact area/overlay area between the conductive layer 114a and the redistribution elements 104 in the redistribution structure 100 may be increased, thus contact resistance between the conductive layer 114a and the redistribution elements 104 may be reduced. In some embodiments, the redistribution structure 128 further includes conductive pads CP. The conductive pad CP is electrically connected between the conductive layer 114a of the through via structure 116a and the redistribution elements 132. The conductive pads CP may be disposed in the rearmost dielectric layer 130 of the redistribution structure 128 (i.e., the bottommost dielectric layer 130 of the redistribution structure 128 as shown in FIG. 5). The front surface of the through via structure 116a includes the front surfaces of the insulating core 108a and the surrounding seed layer 110 and conductive layer 114a, and is covered by the conductive pad CP. In some embodiments, the front surface of the through via structure 116a is in direct contact with the conductive pad CP. In addition, in some embodiments, an area of the conductive pad CP is greater than an area of the front surface of the through via structure 116a. However, those skilled in the art may adjust the area and shape of the conductive pad CP according to design requirements, the present disclosure is not limited thereto. By disposing the conductive pad CP, a contact area of the through via structure 116a may be expanded to a span of the conductive pad CP, and electrical connection between the through via structure 116a and the redistribution elements 132 may be improved.

Similar to the through via structure 116a, the sidewall of the insulating core 108b of the dipole structure 116b is covered by a portion of the seed layer 110 and the conductive layer 114b, whereas the front surface of the insulating core 108b may not be capped by the seed layer 110 and the conductive layer 114b. The conductive layer 114b extends along the sidewall of the insulating core 108b. In some embodiments, the conductive layer 114b extends vertically, and does not have a horizontally extending portion. In some embodiments, the redistribution structure 128 further includes conductive pads CP1. The conductive pad CP1 is electrically connected between the conductive layer 114b of the dipole structure 116b and the redistribution elements 132. The conductive pads CP1 may be disposed in the rearmost dielectric layer 130 of the redistribution structure 128 (i.e., the bottommost dielectric layer 130 of the redistribution structure 128 as shown in FIG. 5). The front surface of the dipole structure 116b includes the front surfaces of the insulating core 108b and the surrounding seed layer 110 and conductive layer 114b, and is covered by the conductive pad CP1. In some embodiments, the front surface of the dipole structure 116b is in direct contact with the conductive pad CP1. In addition, in some embodiments, the top view shape of the conductive pad CP1 may be linear, circular or polygonal. Those skilled in the art may modify the area and shape of the conductive pad CP1 according to design requirements, the present disclosure is not limited thereto. By disposing the conductive pad CP1, a contact area of the dipole structure 116b may be expanded to a span of the conductive pad CP1, and electrical connection between the dipole structure 116b and the redistribution elements 132 may be improved.

Regarding a manufacturing method of the semiconductor package 10b as shown in FIG. 5, portions of the conductive layers 114a and 114b initially lying over the front surfaces of the insulating cores 108a and 108b may be removed in the step of forming the encapsulant 126 (i.e., step S118 as shown in FIG. 1 and FIG. 2J). In some embodiments, the conductive layers 114a and 114b initially lying over the front surfaces of the insulating cores 108a and 108b are covered by an initial encapsulant (not shown), then a planarization process is performed on the initial encapsulant and those portions of the conductive layers 114a and 114b, so as to form the encapsulant 126. In this way, the front surfaces of the insulating cores 108a and 108b are no longer covered by the conductive layers 114a and 114b. In addition, the front surfaces of the insulating cores 108a and 108b are substantially coplanar with the front surface of the encapsulant 126.

As above, the semiconductor package of some embodiments in the present disclosure includes through via structures and dipole structures. The through via structures and the dipole structures respectively have an insulating core and a conductive layer covering the sidewall (or the sidewall and the front surface) of the insulating core. The front surfaces of the insulting cores of the through via structures and the dipole structures can be substantially flat, and substantially coplanar with one another. Accordingly, height variation among the through via structures and the dipole structures can be very low. Therefore, the through via structures and/or the dipole structures are much less likely to be recessed from the front surface of the encapsulant laterally encapsulating the through via structures and the dipole structures, thus fails on electrical connection between the through via structures/dipole structures and the components formed on the encapsulant can be avoided. Furthermore, since the front surfaces of the through via structures can be substantially flat, dome structures are absent at top portions of the through via structures. Thereby, problem of dome vertices offset would not occur, and the through via structures can be functioned as reliable alignment references during a die placing process.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a manufacturing method of a semiconductor package is provided. The method comprises: forming a through via structure and a dipole structure over a carrier, wherein the through via structure and the dipole structure respectively include an insulating core and a conductive layer covering the insulating core; attaching a semiconductor die onto the carrier, wherein the through via structure and the dipole structure are located aside the semiconductor die; laterally encapsulating the though via structure, the dipole structure and the semiconductor die with an encapsulant; and removing the carrier.

In another aspect of the present disclosure, a manufacturing method of a semiconductor package is provided. The method comprises: forming an insulating layer over a carrier; patterning the insulating layer to form a first insulating core and a second insulating core; forming a first seed layer and a first conductive layer on a top surface and a sidewall of the first insulating core; forming a second seed layer and a second conductive layer on a top surface and a sidewall of the second insulating core; attaching a semiconductor die onto the carrier, wherein a through via structure comprising the first insulating core, the first seed layer and the first conductive layer as well as a dipole structure comprising the second insulating core, the second seed layer and the second conductive layer are located aside the semiconductor die; laterally encapsulating the through via structure, the dipole structure and the semiconductor die with an encapsulant; and removing the carrier.

In yet another aspect of the present disclosure, a manufacturing method of a semiconductor package is provided. The method comprises: forming a first insulating core and a second insulating core over a carrier; forming a first seed layer and a first conductive layer to cover the first insulating core, wherein the first seed layer and the first conductive layer further laterally extend away from the first insulating core; forming a second seed layer and a second conductive layer to cover the second insulating core; attaching a semiconductor die onto portions of the first seed layer and the first conductive layer laterally extending away from the first insulating core; encapsulating the semiconductor die, the first and second insulating cores, the first and second seed layers and the first and second conductive layers with an encapsulant; and removing the carrier.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a semiconductor die;
   an encapsulant, laterally encapsulating the semiconductor die;
   through via structures, extending through the encapsulant, and distributed around the semiconductor die; and
   dipole structures, extending through the encapsulant, and arranged along edges of the encapsulant,
   wherein the through via structures and the dipole structures respectively comprise:
   an insulating core; and
   a seed layer as well as a conductive layer, wrapping around the insulating core.

2. The semiconductor package according to claim 1, wherein the through via structures are greater in height as compared to the dipole structures.

3. The semiconductor package according to claim 1, wherein the through via structures are laterally surrounded by the dipole structures.

4. The semiconductor package according to claim 1, wherein top ends of the through via structures and the dipole structures are substantially coplanar with a top surface of the encapsulant.

5. The semiconductor package according to claim 4, wherein the top ends of the through via structures and the dipole structures are defined by laterally spanning portions of the conductive layers covering top surfaces of the insulating cores.

6. The semiconductor package according to claim 4, wherein the top ends of the through via structures and the dipole structures are defined by top surfaces of the insulating cores and top ends of the seed layers and the conductive layers.

7. The semiconductor package according to claim 1, further comprising:
   an additional seed layer and an additional conductive layer, lying along a bottom side of the semiconductor die, and connected to seed layers and the conductive layers of a group of the through via structures nearest to the semiconductor die.

8. A semiconductor package, comprising:
   a first redistribution structure;
   a semiconductor die, attached onto the first redistribution structure;
   an encapsulant, disposed on the first redistribution structure, and laterally encapsulating the semiconductor die;
   through via structures, distributed around the semiconductor die in the encapsulant, and respectively comprising a first insulating core and a first conductive layer wrapping around the first insulating core;
   dipole structures, separated arranged around the through via structures in the encapsulant, and respectively comprising a second insulating core and a second conductive layer wrapping around the second insulating cores; and
   first electrical connectors, disposed at a side of the first redistribution structure facing away from the semiconductor die.

9. The semiconductor package according to claim 8, wherein the first redistribution structure comprises a stack of dielectric layers and conductive features spreading in the dielectric layers, the through via structures extend through a topmost one of the dielectric layers, and the dipole structures are disposed on the topmost one of the dielectric layers.

10. The semiconductor package according to claim 9, wherein the first conductive layers of the through via structures are directly in contact with a group of the conductive features embedded in the dielectric layers, and the second conductive layers of the dipole structures are separated from the conductive features by the topmost one of the dielectric layers.

11. The semiconductor package according to claim 8, further comprising:
a second redistribution structure, disposed on the encapsulant, and comprising a stack of dielectric layers and conductive features spreading in the dielectric layers.

12. The semiconductor package according to claim 11, wherein the first insulating cores of the through via structures are separated from the second redistribution structure via the first conductive layers of the through via structures, and the second insulating cores of the dipole structures are separated from the second redistribution structure via the second conductive layers of the dipole structures.

13. The semiconductor package according to claim 11, wherein the first insulating cores of the through via structures and the second insulating cores of the dipole structures are in direct contact with the second redistribution structure.

14. The semiconductor package according to claim 13, wherein the conductive features of the second redistribution structure comprise conductive pads in direct contact with the first insulating cores and the first conductive layers of the through via structures as well as the second insulating cores and the second conductive layers of the dipole structures.

15. The semiconductor package according to claim 11, further comprising:
second electrical connectors, disposed at a side of the second redistribution structure facing away from the semiconductor die.

16. A semiconductor package, comprising:
a first redistribution structure;
a semiconductor die, attached onto the first redistribution structure;
an encapsulant, disposed on the first redistribution structure, and laterally encapsulating the semiconductor die;
through via structures, distributed around the semiconductor die in the encapsulant, and respectively comprising a first insulating core and a first conductive layer wrapping around the first insulating core;
a second redistribution structure, disposed on the encapsulant; and
an antenna package, attached onto the second redistribution structure.

17. The semiconductor package according to claim 16, wherein the antenna package comprises:
an antenna die; and
an interconnection structure, disposed along a bottom side of the antenna die, and comprising a stack of dielectric layers and conductive features formed in the dielectric layers.

18. The semiconductor package according to claim 17, wherein the conductive features comprise a ground plane overlapping the semiconductor die and the through via structures.

19. The semiconductor package according to claim 17, wherein antenna patches are disposed at opposite sides of the antenna die, and are located between the underlying semiconductor die and the underlying through via structures.

20. The semiconductor package according to claim 16, wherein the antenna package is attached to the second redistribution structure via electrical connectors.

* * * * *